(12) United States Patent
Hanabata

(10) Patent No.: US 6,478,412 B1
(45) Date of Patent: Nov. 12, 2002

(54) PIEZOELECTRIC THIN FILM DEVICE, ITS PRODUCTION METHOD, AND INK-JET RECORDING HEAD

(75) Inventor: Makoto Hanabata, Hyogo (JP)

(73) Assignee: Kansai Research Institute, Osaka (JP)

( * ) Notice: Subject to any disclaimer, the term of this patent is extended or adjusted under 35 U.S.C. 154(b) by 0 days.

(21) Appl. No.: 09/623,482

(22) PCT Filed: Jan. 21, 2000

(86) PCT No.: PCT/JP00/00304

§ 371 (c)(1),
(2), (4) Date: Sep. 14, 2000

(87) PCT Pub. No.: WO00/44054

PCT Pub. Date: Jul. 27, 2000

(30) Foreign Application Priority Data

Jan. 22, 1999 (JP) .......................... 11-014396
May 11, 1999 (JP) .......................... 11-129437
Nov. 15, 1999 (JP) .......................... 11-324721

(51) Int. Cl.⁷ .............................. B41J 2/045
(52) U.S. Cl. ................................. 347/71
(58) Field of Search .................... 347/71, 70, 68; 400/120.16, 120.17, 124.07, 124.18, 124.15, 124.16, 124.29; H01L 41/08; B41J 2/045, 2/055, 2/16

(56) References Cited

U.S. PATENT DOCUMENTS

| | | | |
|---|---|---|---|
| 5,245,244 A | * 9/1993 | Takahashi et al. | 310/328 |
| 5,466,985 A | * 11/1995 | Suzuki | 347/19 |
| 5,593,495 A | 1/1997 | Masuda et al. | 117/4 |
| 5,754,205 A | * 5/1998 | Miyata et al. | 347/70 |
| 6,013,970 A | 1/2000 | Nishiwaki et al. | 310/330 |
| 6,019,458 A | * 2/2000 | Shimada et al. | 347/70 |
| 6,126,279 A | * 10/2000 | Shimada et al. | 347/70 |
| 6,176,570 B1 | * 1/2001 | Kishima et al. | 347/70 |
| 6,186,618 B1 | * 2/2001 | Usui et al. | 347/70 |
| 6,260,956 B1 | * 7/2001 | Narang et al. | 347/63 |

FOREIGN PATENT DOCUMENTS

| | | |
|---|---|---|
| JP | 07060960 A | 3/1995 |
| JP | 10020488 A | 1/1998 |

* cited by examiner

Primary Examiner—John Barlow
Assistant Examiner—K. Feggins
(74) Attorney, Agent, or Firm—Rader, Fishman & Grauer PLLC

(57) ABSTRACT

The present invention provides a piezoelectric thin film element comprising a piezoelectric thin film having a uniform specific shape, a process for producing the same, and an ink jet recording head using the piezoelectric thin film element.

A piezoelectric thin film element (1) comprises a substrate (5), a lower electrode (2), a piezoelectric thin film (3) and an upper electrode (4) in this order. A vertical cross-sectional shape and/or a vertical longitudinal sectional shape of the piezoelectric thin film (3) with respect to the substrate (5) is a quadrilateral having upper and lower sides mutually facing and substantially parallel to each other and both lateral sides. A length Lu of the upper side and a length Lb of the lower side preferably satisfy the relationship of Lu>Lb. Angles $\theta l$ and $\theta r$ defined between the lower side and the respective lateral sides are expressed as follows: $90°<\theta l<150°$ and $90°<\theta r<150°$. The piezoelectric thin film is formed by photo-fabrication using a photosensitive composition capable for forming a ferroelectric thin film. An ink jet recording head using said piezoelectric thin film element.

30 Claims, 4 Drawing Sheets

PRIOR ART

PIEZOELECTRIC THIN FILM DEVICE, ITS PRODUCTION METHOD, AND INK-JET RECORDING HEAD

TECHNICAL FIELD

The present invention relates to a piezoelectric thin film element including a piezoelectric thin film having a specific shape for use in a micro pump, an ink jet recording head, a micro mirror device, a micro mechanical device, a micro machine, an ultrasonic vibrator or the like. Furthermore, the present invention relates to a process for producing the piezoelectric thin film element including the piezoelectric thin film having the specific shape by the use of a photosensitive composition capable of forming a ferroelectric thin film. Moreover, the present invention relates to an ink jet recording head having the piezoelectric thin film element.

The present invention relates to a piezoelectric thin film element of a bending mode called a bimorph or a unimorph.

In a piezoelectric thin film element of a bending mode, a lower electrode, a piezoelectric thin film and an upper electrode are laminated in this order on a substrate. Although the piezoelectric thin film is to be expanded or contracted in a direction parallel to the substrate with the application of a voltage, it is restricted by the substrate on a side of the lower electrode, to be thus flexed in a direction perpendicular to the substrate in the same manner as a bimetal.

Such a piezoelectric thin film element of a bending mode is applied to various kinds of products. The piezoelectric thin film element according to the present invention is an element suitable for, in particular, an ink jet recording head.

The ink jet recording head generally comprises ink chambers, nozzles communicating with the ink chambers and ink supplying means communicating with the ink chambers, wherein a capacity of the ink chamber is varied by the use of a piezoelectric element so that ink is discharged from the nozzle under pressure generated at that time.

BACKGROUND ART

In order to efficiently produce a fine piezoelectric thin film element, a piezoelectric thin film for a piezoelectric thin film element has been recently formed by applying piezoelectric paste including a starting material of ferroelectric oxide onto a substrate by a thick film method such as a screen printing, followed by firing, as disclosed in, for example, Japanese Laid-open Patent Publication No. 7-60960/1995. A method typified by the screen printing is advantageous in very efficient production of the piezoelectric thin film, but at the same time, involves some deficiencies.

One of the deficiencies is that there easily occurs variations in shape of an obtained piezoelectric thin film. FIG. 6 is a sectional view schematically showing a typical piezoelectric thin film element formed by a screen printing. In FIG. 6, a lower electrode (12), a piezoelectric thin film (13) and an upper electrode (14) are laminated in this order on a substrate (15). The upper surface of the piezoelectric thin film (13) is curved, and therefore, the bottom surface of the thin film (13) is not parallel to the upper surface thereof. Furthermore, the piezoelectric thin film (13) is thick at the center thereof but thin at the periphery thereof. The cross-sectional shape of the piezoelectric thin film (13) is ark-shaped, and therefore, each of the angles defined between a lower side and both lateral sides is acute. The shape of this piezoelectric thin film (13) depends on various conditions of an applying process, a firing process and the like, thereby variations in the shape are liable to occur. Therefore, variations in displacement characteristics are liable to occur even in elements of the same design.

Another deficiency is non-uniformity caused by easy concentration of an electric field density at the periphery of the piezoelectric thin film where an electrode interval is narrow since an distance between the upper electrode (14) and the lower electrode (12) is not fixed in the case where a voltage is applied to the piezoelectric thin film element, in the piezoelectric thin film having the sectional shape shown in FIG. 6.

Furthermore, a region contributory to a displacement of an actuator is limited, so that the displacement cannot be increased in the piezoelectric thin film having the cross-sectional shape shown in FIG. 6. That is, a region effective in the displacement of the actuator is a portion sandwiched between the upper electrode (14) and the bottom surface of the piezoelectric thin film (13) out of the entire area of the thin film. In the element shown in FIG. 6, only a portion considerably narrower than the bottom surface of the piezoelectric thin film (13) is the region effective in the displacement. If the area of the upper electrode (14) is enlarged to widen the region effective in the displacement, short-circuiting is liable to occur between the lower electrode (12) and the upper electrode (14). In view of this, it is necessary to make the area of the upper electrode (14) narrower than that of the upper surface of the piezoelectric thin film (13) so as to allow a considerable portion having no electrode to remain at the peripheral edge portion at the upper surface of the piezoelectric thin film (13). Consequently, it is impossible to effectively use the entire region of the piezoelectric thin film, thereby making it difficult to provide sufficient element characteristics.

In this manner, in the case where the piezoelectric thin film produced by the screen printing is used as an actuator for an ink jet recording head, there arises a problem that it is impossible to provide an ink jet recording head having nozzles arrayed at a high density since ink cannot be accurately discharged caused by great variation in displacement or an insufficient displacement due to a non-uniform electric field (i.e., poor conversion efficiency), as described above.

In the meantime, FIG. 7 is a sectional view schematically showing a conventional piezoelectric thin film element which has been publicly known. In FIG. 7, a lower electrode (22), a piezoelectric thin film (23) and an upper electrode (24) are laminated in this order on a substrate (25). The cross-sectional shape of the thin film (23) is rectangular, the thickness thereof is fixed and the distance between the upper electrode (24) and the lower electrode (22) is fixed, thus obtaining a uniform electric field. In order to enlarge a region effective in displacement, it is preferable that the upper electrode (24) should have a larger area. However, like the element shown in FIG. 6, it is necessary to make the area of the upper electrode (24) narrower than that of the upper surface (i.e., the area of the bottom surface) of the piezoelectric thin film (23) so as to avoid any short-circuiting between the lower electrode (22) and the upper electrode (24). That is, it is impossible to effectively use the entire area of the bottom surface of the piezoelectric thin film. Thus, there arises a problem that it is impossible to provide an ink jet recording head having nozzles arrayed at a high density.

DISCLOSURE OF THE INVENTION

Objects of the Invention

Accordingly, an object of the present invention is to solve the above-described problems in the prior art and to provide a piezoelectric thin film element including a piezoelectric thin film having a specific shape. Furthermore, another object of the present invention is to provide a process for producing the piezoelectric thin film element including the piezoelectric thin film having the specific shape according to the present invention by the use of a photosensitive composition capable of forming a ferroelectric thin film. Moreover, a further object of the present invention is to provide an ink jet recording head provided with the piezoelectric thin film element having the specific shape according to the present invention.

SUMMARY OF THE INVENTION

As a result of earnest study, the present inventor has accomplished a piezoelectric thin film having a specific sectional shape according to the present invention. A piezoelectric thin film element according to the present invention is featured by a greater displacement and smaller scattering in piezoelectric characteristics than a conventional piezoelectric thin film element.

Additionally, as a result of earnest study, the present inventor-has accomplished the present invention by the finding of a process for producing a piezoelectric thin film having a specific shape, in which a photosensitive composition capable of forming a ferroelectric thin film is applied onto a substrate, followed by subjecting the obtained photosensitive layer to light exposure of a predetermined pattern, development and firing, as an easier process for producing the above-described piezoelectric thin film element than the conventional screen printing.

That is, the present invention relates to a piezoelectric thin film element comprising a substrate, a lower electrode formed on said substrate, a piezoelectric thin film formed on said lower electrode and an upper electrode formed on said piezoelectric thin film,
  wherein a vertical cross-sectional shape and/or a vertical longitudinal sectional shape of said piezoelectric thin film with respect to said substrate is a quadrilateral having upper and lower sides mutually facing and substantially parallel to each other and both lateral sides, and
  angles θl and θr defined between the lower side and the respective lateral sides are:
    90°<θl<150° and/or
    90°<θr<150°.

In the present invention, the thickness of said piezoelectric thin film is preferably 1 µm to 25 µm.

In the present invention, it is preferable that in the quadrilateral in the vertical section of the piezoelectric thin film, a length Lu of the upper side and a length Lb of the lower side should satisfy the relationship of Lu>Lb.

In the present invention, the difference between the maximum thickness and the minimum thickness of said piezoelectric thin film at arbitrary points is preferably less than 1 µm.

In the present invention, said piezoelectric thin film preferably comprises mainly lead zirconate titanate.

The present invention also relates to a process for producing the above-described piezoelectric thin film element. That is, the present invention relates to a process for producing a piezoelectric thin film element comprising a substrate, a lower electrode formed on said substrate, a piezoelectric thin film formed on said lower electrode and an upper electrode formed on said piezoelectric thin film,
  wherein a vertical cross-sectional shape and/or a vertical longitudinal sectional shape of said piezoelectric thin film with respect to said substrate is a quadrilateral having upper and lower sides mutually facing and substantially parallel to each other and both lateral sides, and
  angles θl and θr defined between the lower side and the respective lateral sides are:
    90°<θl<150° and/or
    90°<θr<150°.
  which comprises:
    applying a photosensitive composition capable of forming a ferroelectric thin film onto the lower electrode to form a photosensitive layer; and
    subjecting the photosensitive layer to light exposure of a predetermined pattern, followed by development and firing, thereby forming the predetermined pattern.

In the producing process according to the present invention, it is preferable that in the quadrilateral in the vertical section of the piezoelectric thin film, a length Lu of the upper side and a length Lb of the lower side should satisfy the relationship of Lu>Lb.

In the production process of the present invention, said photosensitive composition capable of forming the ferroelectric thin film is not particularly limited, but there can be mentioned e.g. the following 2 types of photosensitive compositions:

The first is a photosensitive composition (type I) comprising at least an organic polymer (A) and a ferroelectric fine particle (Bp) having photosensitive groups on at least a part of the surface thereof.

In this case (type I), said ferroelectric fine particles (Bp) comprising mainly lead zirconate titanate are preferably used. Further, non-photosensitive, ferroelectric fine particles can also be used in combination.

Further, it is also possible to use a photosensitive composition comprising said organic polymer (A), at least a part of which is a photosensitive organic polymer (Ap), and further comprising a photosensitizer (A2) and/or a photopolymerizable monomer (A3) as necessary.

When the photosensitive organic polymer (Ap) is used, it is preferable to use a photosensitive composition comprising the photosensitive organic polymer (Ap), the photosensitizer (A2) and/or the photopolymerizable monomer (A3) as necessary, and the ferroelectric fine particle (B) [the total of said ferroelectric fine particle (Bp) and said ferroelectric fine particle having no photoreactive group] at a compounding ratio of 0.5<(B)/[(Ap)+(A2)+(A3)+(B)]<0.99 in terms of the ratio of solid contents by weight.

As the photosensitizer (A2), a compound having a high coefficient of absorption is preferably selected from azide compounds, benzophenone derivatives, benzoin ether derivatives and thioxanthone derivatives.

The second is a photosensitive composition (type II) comprising at least a precursor sol of ferroelectric oxide (Sp) containing titanium, zirconium and lead as constitutional metal elements and simultaneously having photoreactive groups, and an organic polymer (A).

In this case (type II), it is possible to use a photosensitive composition comprising said organic polymer (A), at least a part of which is the photosensitive organic polymer (Ap), and further comprising the photosensitizer (A2) and/or the photopolymerizable monomer (A3) as necessary.

When the photosensitive organic polymer (Ap) is used, it is preferable to use a photosensitive composition comprising, in terms of solid content, 1 to 100 parts by weight of the organic polymer (A) relative to 100 parts by weight of the precursor sol of ferroelectric oxide (Sp).

Further in this case (type II), a photosensitive composition comprising the ferroelectric oxide fine particle (B) can also be used. As the ferroelectric oxide fine particle (B), a fine particle (Bp) having photoreactive groups on at least a part of the surface thereof can also be used. The ferroelectric fine particle (B) comprising mainly lead zirconate titanate is preferably used.

When the ferroelectric oxide fine particle (B) is used, it is preferable to use a photosensitive composition comprising, in terms of solid content, 1 to 100 parts by weight of the organic polymer (A) and 1 to 10,000 parts by weight of the ferroelectric oxide fine particle (B) relative to 100 parts by weight of the precursor sol of ferroelectric oxide (Sp).

In the present invention, the photosensitive organic polymer (Ap) can be used as a part or the whole of said organic polymer (A), and a negative-photosensitive organic polymer can be used as the photosensitive organic polymer (Ap). Further, the fine particle (Bp) having photoreactive groups can be used as the ferroelectric fine particle (B), and the ferroelectric fine particles (Bp) having negative-working photoreactive groups can be used as said fine particle (Bp).

In the producing process according to the present invention, the lower electrode is formed on the substrate by a normal process, the piezoelectric thin film is formed on the lower electrode, and then the upper electrode is formed on the piezoelectric thin film by the normal process, thereby obtaining the piezoelectric thin film element.

Moreover, the present invention relates to an ink jet recording head having the said piezoelectric thin film element. That is, the present invention relates to an ink jet recording head comprising: at least one of said piezoelectric thin film element or said piezoelectric thin film element obtained by the above-described producing process; at least one ink chamber; and at least one ink discharging nozzle.

In said ink jet recording head, assuming that $Lb_1$ represents a length in a width direction of a bottom surface of said piezoelectric thin film and $C_1$ represents a length in a width direction of said ink chamber, the relationship below is preferably established: $0.50\ C_1 \leq Lb_1 \leq 0.95\ C_1$, more preferably, $0.65\ C_1 \leq Lb_1 \leq 0.90\ C_1$.

In the said ink jet recording head, assuming that $Lu_1$ represents a length in a width direction of an upper surface of said piezoelectric thin film and $C_2$ represents a length in a longitudinal direction of said ink chamber, the relationship below is preferably established: $5 \leq C_2/Lu_1 \leq 50$, more preferably, $8 \leq C_2/Lu_1 \leq 35$.

In said ink jet recording head, assuming that $C_1$ represents a length in a width direction of said ink chamber, the relationship below is preferably established: $20\ \mu m \leq C_1 \leq 500\ \mu m$, more preferably, $30\ \mu m \leq C_1 \leq 300\ \mu m$.

In said ink jet recording head, assuming that $Lb_1$ represents a length in a width direction of a bottom surface of said piezoelectric thin film, $Eu_1$ represents a length in a width direction of said upper electrode and $Lu_1$ represents a length in a width direction of an upper surface of said piezoelectric thin film, the relationship below is more preferably established: $Lb_1 < Eu_1 < Lu_1$.

In said ink jet recording head, assuming that $Lb_1$ represents a length in a width direction of a bottom surface of said piezoelectric thin film, $Lu_1$ represents a length in a width direction of an upper surface of said piezoelectric thin film, $C_1$ represents a length in a width direction of said ink chamber, $C_2$ represents a length in a longitudinal direction of said ink chamber and $Eu_1$ represents a length in a width direction of said upper electrode, the relationships below are more preferably established:

$0.50\ C_1 \leq Lb_1 \leq 0.95\ C_1$;

$5 \leq C_2/Lu_1 \leq 50$; and $Lb_1 < Eu_1 < Lu_1$.

DETAILED DESCRIPTION OF THE INVENTION

Description will be given of one example of the piezoelectric thin film element of the present invention in reference to FIGS. 1, 2 and 3.

Figure 1:
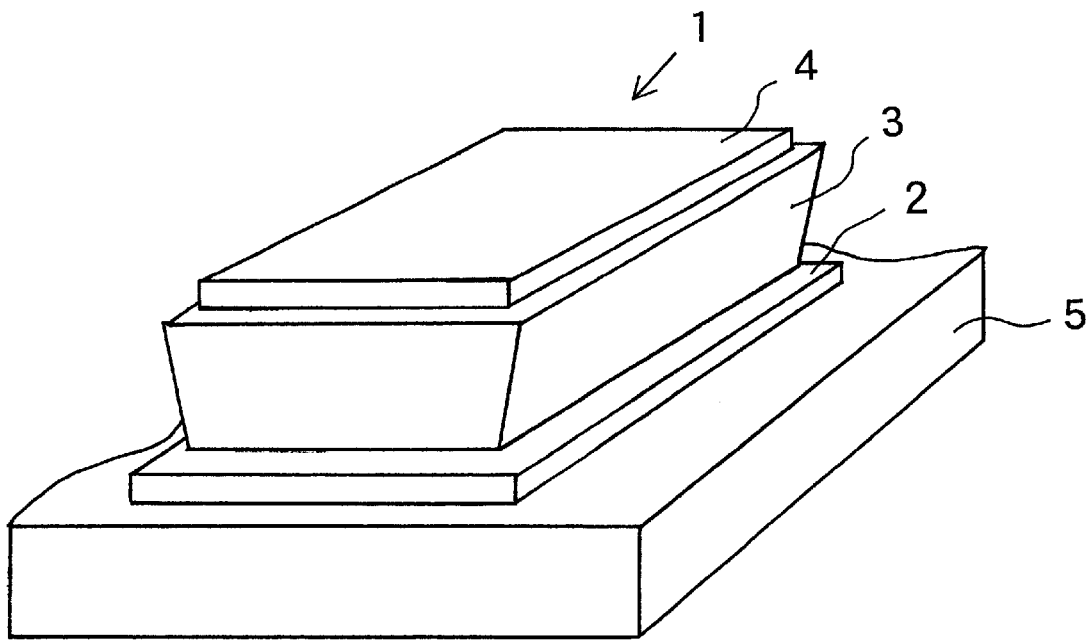
FIG. 1 is a perspective view schematically showing one example of the piezoelectric thin film element of the present invention.
Figure 2:
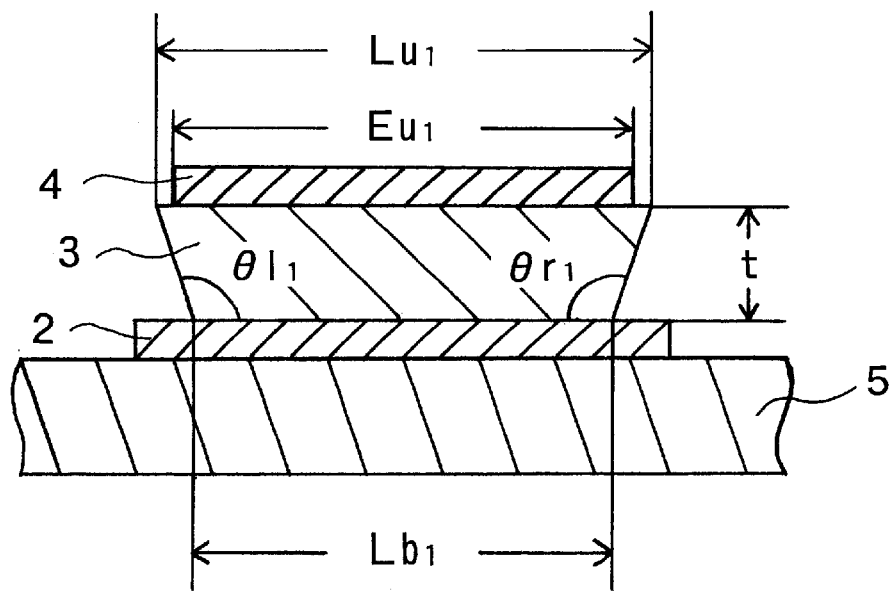
FIG. 2 is a vertical cross-sectional view showing the piezoelectric thin film element of FIG. 1.
Figure 3:
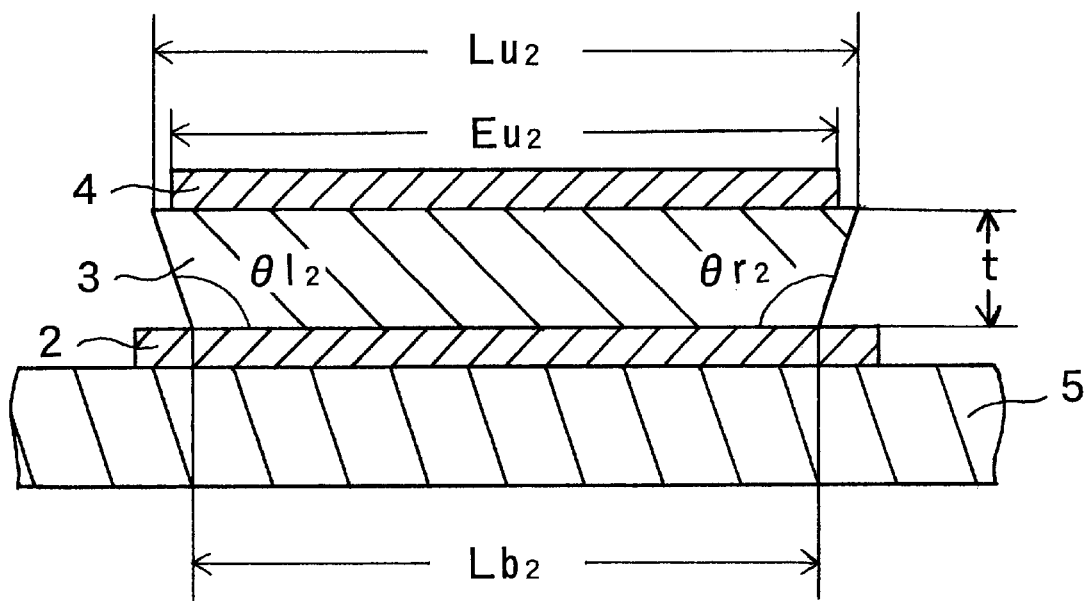
FIG. 3 is a vertical longitudinal sectional view showing the piezoelectric thin film element of FIG. 1.

In FIGS. 1, 2 and 3, a piezoelectric thin film element (1) of the present invention comprises a substrate (5), a lower electrode (2) formed on the substrate (5), a piezoelectric thin film (3) formed on the lower electrode (2) and an upper electrode (4) formed on the piezoelectric thin film (3).

The piezoelectric thin film (3) constituting the element of the present invention is featured by its vertical sectional shape. The piezoelectric thin film of the present invention is featured in that either one of two angles defined between a lower side (on a side of the lower electrode) and respective lateral sides in the vertical section of a piezoelectric body is greater than 90° and smaller than 150°.

For example, as shown in FIG. 2, a vertical cross-sectional shape (with respect to the substrate (5)) is a quadrilateral having upper and lower sides mutually facing and substantially parallel to each other and both lateral sides, wherein a length $Lu_1$ of the upper side and a length $Lb_1$ of the lower side satisfy the relationship of $Lu_1 > Lb_1$. Moreover, an angle $\theta l_1$ defined between the lower side and the left lateral side shown in FIG. 2 is $90° < \theta l_1 < 150°$, preferably, $90° < \theta l_1 < 120°$, and/or an angle $\theta r_1$ defined between the lower side and the right lateral side shown in FIG. 2 is $90° < \theta r_1 < 150°$, preferably, $90° < \theta r_1 < 120°$.

Furthermore, for example, as shown in FIG. 3, a vertical longitudinal sectional shape (with respect to the substrate (5)) is a quadrilateral having upper and lower sides mutually facing-and substantially parallel to each other and both lateral sides, wherein a length $Lu_2$ of the upper side and a length $Lb_2$ of the lower side satisfy the relationship of $Lu_2 > Lb_2$. Moreover, an angle $\theta l_2$ defined between the lower side and the left lateral side shown in FIG. 3 is $90° < \theta l_2 < 150°$, preferably, $90° < \theta l_2 < 120°$, and/or an angle $\theta r_2$ defined between the lower side and the right lateral side shown in FIG. 3 is $90° < \theta r_2 < 150°$, more preferably, $90° < \theta r_2 < 120°$.

Figure 6:
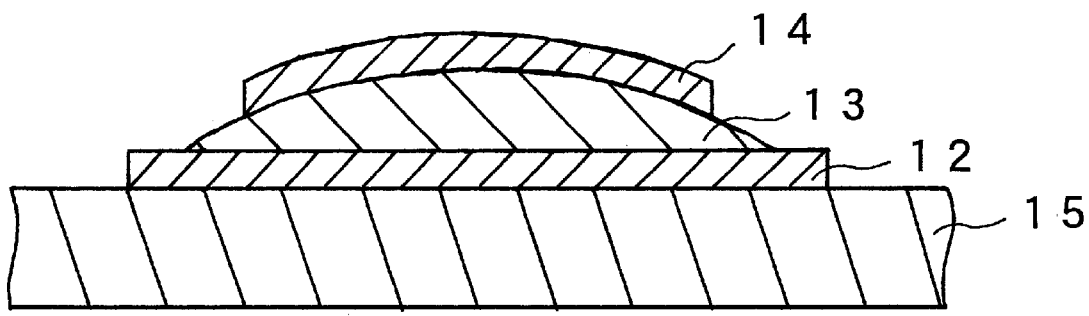
FIG. 6 is a vertical sectional view showing a piezoelectric thin film element which is produced by a conventional screen printing.
Figure 7:
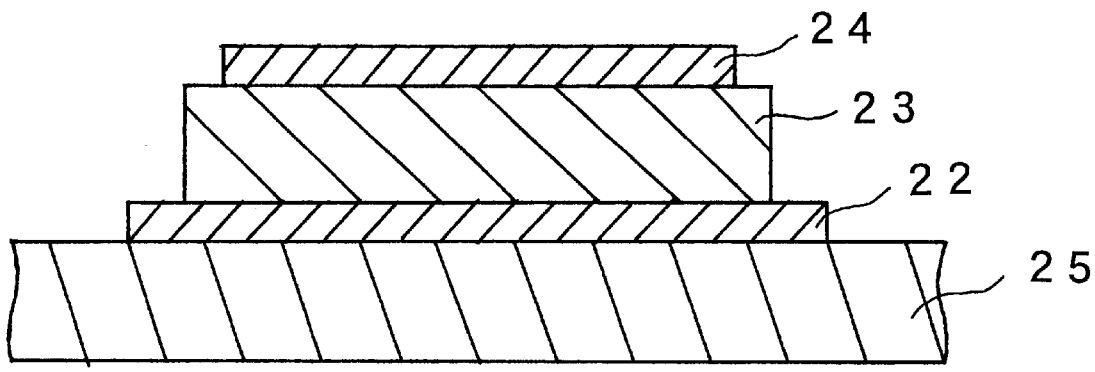
FIG. 7 is a vertical sectional view showing a piezoelectric thin film element in the prior art.

The above-described piezoelectric thin film element having the specific shape can provide a large displacement as an actuator in comparison with the element including the piezoelectric thin film having a rectangular cross section which has been conventionally known to the public, as shown in FIG. 7, or the element shown in FIG. 6, for the reasons below.

As described above, the area, in which the bottom and upper surfaces of the thin film (13) are parallel to each other, is small in the element shown in FIG. 6. In order to prevent any short-circuiting between the lower electrode (12) and the upper electrode (14), it is necessary to make the area of the upper electrode (14) smaller than that of the upper surface of the thin film (13), thereby allowing a portion having no electrode to considerably remain at the peripheral edge portion at the upper surface of the thin film (13). Therefore, a region contributory to the displacement of the actuator is restricted, so that a displacement cannot be increased. In the element shown in FIG. 7, the bottom and upper surfaces of the thin film (23) are parallel to each other. However, even if the area of the upper electrode (24) is to be enlarged so as to enlarge a region effective in a displacement, it is necessary to make the area of the upper electrode (24) smaller than that of the upper surface of the thin film (23) (i.e., the area of the bottom surface) in order to prevent any short-circuiting between the lower electrode (22) and the upper electrode (24). In other words, the entire area of the bottom surface of the piezoelectric thin film cannot serve as an effective displacement region.

To the contrary, in the element of the present invention, since the bottom and upper surfaces of the thin film (3) are parallel to each other and the angles $\theta l_1$, $\theta r_1$, $\theta l_2$ and $\theta r_2$ defined between the lower side and the respective lateral sides are greater than 90° and smaller than 150° in the section of the thin film (3), the area of the upper electrode can be readily enlarged even if a portion having no electrode is secured at the peripheral edge portion at the upper surface of the thin film (3), as shown in FIG. 2 and FIG. 3. Furthermore, if the upper electrode (4) is provided to an extent of the area equal to or greater than that of the bottom surface of the piezoelectric thin film (3), the region effective in the displacement of the actuator can become as wide as the bottom surface of the piezoelectric thin film (3). In this manner, in the element of the present invention, it is possible to enlarge the region effective in the displacement in comparison with the conventional element without causing any short-circuiting between the lower electrode (2) and the upper electrode (4), thereby making it possible to obtain a larger displacement. From this viewpoint, the angles $\theta l$ and/or $\theta r$ defined between the lower side and the respective lateral sides need exceed 90° in the section of the thin film (3). The upper limit of each of these angles is smaller than 150° in consideration of the production of the thin film.

In the elements shown in FIG. 6 and FIG. 7, since the function of the actuator significantly depends upon the area of the upper electrode, there arises a problem that variations in characteristics are liable to occur between the elements in the case of low patterning accuracy.

In contrast, in the element of the present invention, even if variations slightly occur in the patterning when a width ($Eu_1$) of the upper electrode (4) is greater than a width ($Lb$,) of the bottom surface of the piezoelectric thin film (3), there is no large change in area sandwiched between the bottom surface of the piezoelectric thin film (3) and the upper electrode (4), thereby preventing any occurrence of the variations in the characteristics of the actuator. Consequently, in the case where the element of the present invention is used as an actuator for an ink jet recording head or the like, it is possible to provide heads having the same discharging characteristics without any variation in the characteristics between the elements.

It is preferable that the thickness (t) of the piezoelectric thin film (3) is 1 $\mu$m to 25 $\mu$m in order to use as an actuator for an ink jet recording head. If the thickness is less than 1 $\mu$m, it becomes difficult to obtain force enough to flex the substrate. In contrast, if the thickness exceeds 25 $\mu$m, the strength of the piezoelectric thin film per se is increased, and also in this case, the flexure of the substrate is tended to be decreased.

The difference between the maximum thickness and the maximum thickness at an arbitrary point in the piezoelectric thin film (3) is preferably less than 1 $\mu$m. more preferably, less than 0.5 $\mu$m. That is, with the higher parallelism between the upper and bottom surfaces of the piezoelectric thin film (3), the parallelism between the upper electrode and the lower electrode can be maintained, thus obtaining a more proper displacement and enhancing ink discharging accuracy. The film thickness can be measured by the use of, for example, a contact surface roughness measuring device. It is preferable that a deviation of the thickness at the arbitrary point in the piezoelectric thin film (3) from an average thickness should fall within 7% of the average thickness. When such a condition is satisfied, a uniform electric field can be produced between the electrodes, and further, an adhesion between the electrode and the piezoelectric thin film can be enhanced and the durability of the element can be improved.

The piezoelectric thin film (3) having the above-described vertical sectional shape is novel, and preferably, it may be formed by a producing process using a photosensitive composition, described later. Alternatively, the piezoelectric thin film (3) may be formed by sputtering or hydrothermal synthesis. By these methods, the piezoelectric thin film having the specific sectional shape of the present invention may be formed under various etching conditions.

It is preferable that the piezoelectric thin film (3) comprises mainly lead zirconate titanate in order to obtain a sufficient displacement as an actuator for ink jet recording head.

Material of the substrate (5) is not particularly limited, and may be selected from ceramic, glass, metal and the like. Specifically, examples of the material of the substrate (5) include zirconia, alumina, magnesia, silicon nitride, aluminum nitride, silicon carbide, silicon oxide, silicon and the like. The thickness of the substrate (5) is not particularly limited, and is preferably 1 $\mu$m to 100 $\mu$m, more preferably 1 $\mu$m to 50 $\mu$m.

The material for the lower electrode (2) is not particularly limited insofar as it is conventionally used in a piezoelectric thin film element. For example, Pt, Au etc. can be mentioned. Further, the material for the upper electrode (4) is not particularly limited either insofar as it is conventionally used in a piezoelectric thin film element. For example, Au, Pt etc. can be mentioned. The thickness of each of the electrodes (2) and (4) is not particularly limited either, and its thickness is e.g. about 0.05 to 2 $\mu$m.

Further, an adhesion layer consisting of e.g. Ti may be provided between the lower electrode (2) and the piezoelectric thin film (3), and between the piezoelectric thin film (3) and the upper electrode (4). In the present invention, it is enough for the piezoelectric thin film (3) to have said characteristic structure in a specific section, and other modifications are also possible.

Figure 4:
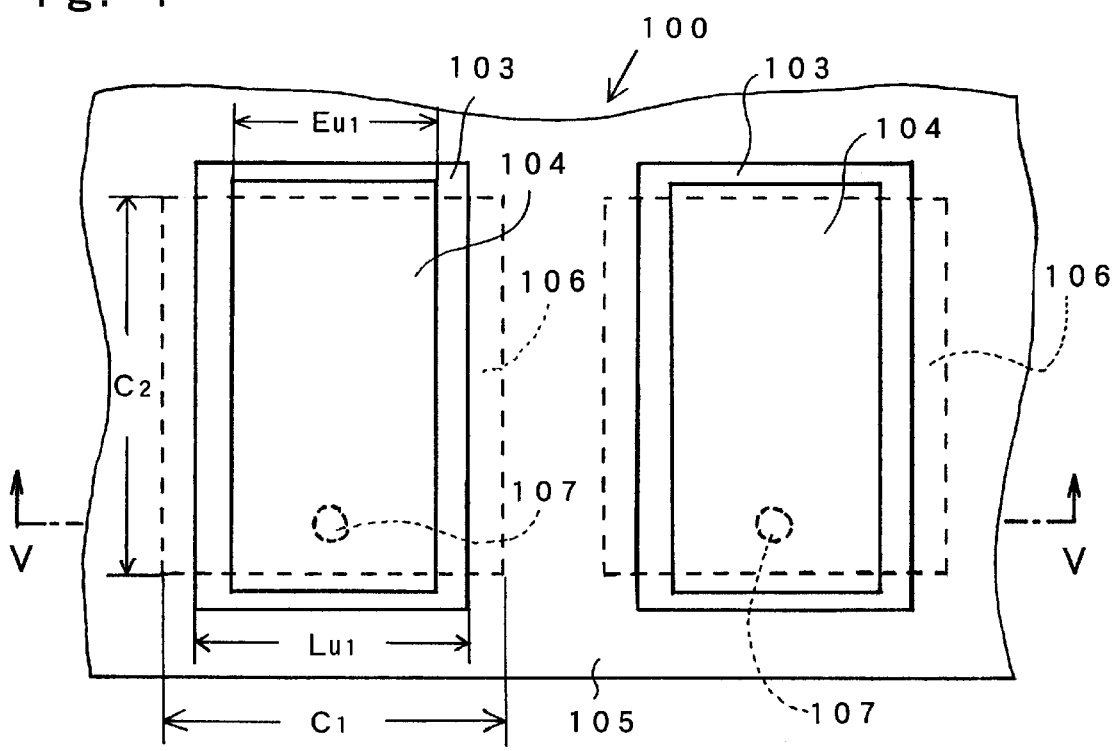
FIG. 4 is a plan view schematically showing essential parts of one example of the ink jet recording head provided with a plurality of piezoelectric thin film elements of the present invention.
Figure 5:
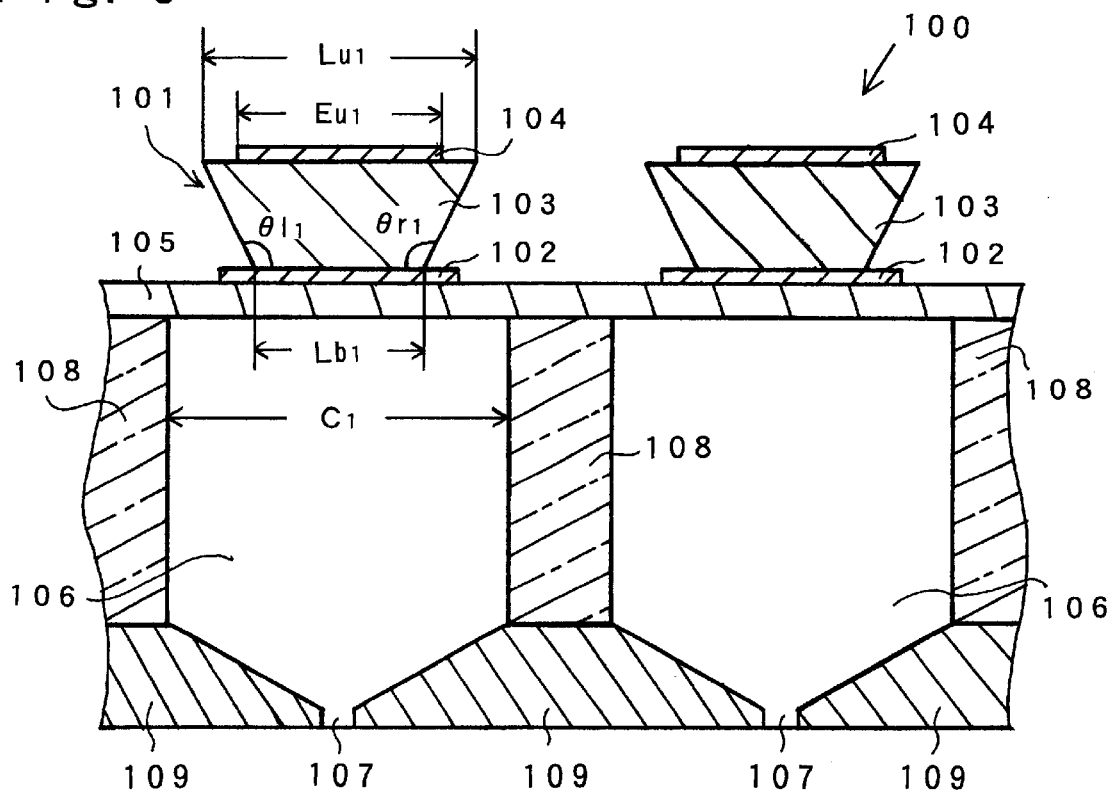
FIG. 5 is a vertical sectional view schematically showing one example of the ink jet recording head provided with the plurality of piezoelectric thin film elements of the present invention, taken along a line V—V of FIG. 4.

The piezoelectric thin film element according to the present invention can be suitably used as an actuator for an ink jet recording head. Referring to FIG. 4 and FIG. 5, explanation will be made on one embodiment of the ink jet recording head using the piezoelectric thin film element according to the present invention. FIG. 4 is a plan view schematically showing essential parts of the ink jet recording head in the one embodiment, in which a plurality of piezoelectric thin film elements according to the present invention are arrayed in the width direction thereof, mainly illustrating the positional interrelation among an upper electrode, an upper surface of a piezoelectric thin film and an ink chamber in a plan view. FIG. 5 is a vertical sectional view taken along a line V—V of FIG. 4.

In FIGS. 4 and 5, the ink jet recording head (100) comprises: a piezoelectric thin film element (101) having a lower electrode (102) formed on a vibrating plate (105) serving as a substrate, a piezoelectric thin film (103) and an upper electrode (104); the vibrating plate (105); an ink chamber (106); and an ink discharging nozzle (107) communicating with the ink chamber (106). That is, the piezoelectric thin film (103), the ink chamber (106) and the upper electrode (104) are arrayed in such a manner as to be parallel to each other in their longitudinal directions, and further, the plurality of piezoelectric thin film elements (101), the plurality of ink chambers (106) and the plurality of nozzles (107) are arrayed in a width direction perpendicular to the above-described longitudinal directions. The adjacent ink chambers (106) are partitioned via an ink chamber side wall (108). Each of the nozzles (107) is formed in a nozzle plate (109). Ink is supplied to the ink chamber (106) from an ink tank, not shown, via an ink supplying channel, not shown, to be discharged from the nozzle (107). Although in the present drawings, the nozzles (107) are arrayed in a linear manner, the nozzles may be arrayed in other various manners.

As to reference characters representing dimensions in the drawings, Lb, represents a length in a width direction of a bottom surface of the piezoelectric thin film (103); $Lu_1$, a length in a width direction of an upper surface of the thin film (103); $C_1$, a length in a width direction of the ink chamber (106); $C_2$, a length in a longitudinal direction of the ink chamber (106); and $Eu_1$, a length in a width direction of the upper electrode (104). Furthermore, $\theta_1$ and $\theta r_1$ represent angles defined between a lower side and respective lateral sides in the section of the piezoelectric thin film (103).

In the ink jet recording head (100), It is preferable to establish the relationship of $0.50\ C_1 \leq Lb_1 \leq 0.95\ C_1$, more preferably, $0.65\ C_1 \leq Lb_1 \leq 0.90\ C_1$. If $Lb_1$ is less than $0.50\ C_1$, pressure fluctuations of the ink chamber (106) cannot be sufficiently carried out by the displacement of the vibrating plate (105), so that a suitable ink discharging speed can be hardly achieved. Conversely, if $Lb_1$ exceeds $0.95\ C_1$, a sufficient displacement can be hardly achieved by an Influence of the side wall (108) of the ink chamber (106). Moreover, in the case of a multi-nozzle, crosstalk is liable to occur. This is disadvantageous to a high density. The thickness of the side wall (108) of the ink chamber is preferably 0.1 time to 1.0 time the width $C_1$ of the ink chamber (106).

In the ink jet recording head (100), it is preferable to establish the relationship of $5 \leq C_2/Lu_1 \leq 50$, more preferably, $8 \leq C_2/Lu_1 \leq 35$. If $C_2/Lu_1$ is smaller than 5, that is, in case $Lu_1$ is too greater than $C_2$, it is disadvantageous to the nozzle array at a high density, or in case $C_2$ is too smaller than $Lu_1$, a maximum ink discharge quantity is decreased, which is disadvantageous to printing at a high speed. On the other hand, if $C_2/Lu_1$ exceeds 50, that is, in case $Lu_1$ is too smaller than $C_2$, a great displacement cannot be obtained, so that a sufficient ink discharging speed can be hardy achieved, or in case $C_2$ is too greater than $Lu_1$, it takes time to re-fill the ink into the ink chamber, thereby inducing inconveniences for the ink discharge. For example, the discharge in a high cycle tends to become difficult. In some case, there is a danger that the discharge cannot be performed.

In the ink jet recording head (100), the width $C_1$ of the ink chamber (106) is preferably $20\ \mu m \leq C_2 \leq 500\ \mu m$, more preferably, $30\ \mu m \leq C_1 \leq 300\ \mu m$. If $C_1$ is less than $20\ \mu m$, a sufficient displacement cannot be produced in the vibrating plate (105). In contrast, if $C_1$ exceeds $500\ \mu m$, it is not suitable for the nozzle array at a high density.

Further, in the ink jet recording head (100), it is preferable to establish the relationship of $Lb_1 < Eu_1 < Lu_1$. If $Lb_1 < Eu_1$, the entire region (in the width direction) of the bottom surface of the thin film (103) is used as a region effective in displacement, thereby producing a greater displacement. Furthermore, it is preferable to make it difficult to generate scattering in displacement between the elements even if there are more or less variations in patterning the upper electrode (104). The relationship of $Eu_1 < Lu_1$ is preferable to prevent any short-circuiting between the upper electrode (104) and the lower electrode (102).

In the ink jet recording head (100), it is preferable to establish the relationships of $0.50\ C_1 \leq Lb_1 \leq 0.95\ C_1$, $5 \leq C_2/Lu_1 \leq 50$ and $Lb_1 < Eu_1 < Lu_1$.

In this manner, since the piezoelectric thin film element (101) according to the present invention comprises the thin film (103) having a so-called inverse trapezoidal section having the width $Lu_1$ of the upper surface greater than the width $Lb_1$ of the bottom surface, it is possible to take the great width of the upper electrode (104) so as to produce the great displacement, whereby the electrodes can be readily taken out. In addition, the multi-nozzle head is featured in that scattering in the displacement of the vibrating plate (105) hardly occur even if the variations occur in patterning the upper electrode (104).

Hereinafter, the process for producing said piezoelectric thin film element is described. In the production process of the present invention, a photosensitive composition capable of forming a ferroelectric thin film is used. This photosensitive composition is not particularly limited. insofar as the composition comprises at least one photosensitive constitutional component, possesses photosensitivity as a whole, and can form a ferroelectric thin film by coating and firing.

For example, the constitutional components of the composition include:

Organic polymer (A)

Photosensitive organic polymer (Ap)

Ferroelectric fine particle (B)

Photoreactive group-containing ferroelectric fine particle (Bp)

Precursor sol of ferroelectric oxide (S)

Photoreactive precursor sol of ferroelectric oxide (Sp)

A combination of these components can be used as a composition which as a whole, has photosensitivity and can form a ferroelectric thin film.

For example, the following 2 types of photosensitive compositions comprising a combination of the constitutional components are mentioned as non-limiting examples:

A photosensitive composition (type I) comprising at least an organic polymer (A) and a ferroelectric fine particle (Bp) having photosensitive groups on at least a part of the surface thereof.

A photosensitive composition (type II) comprising comprises at least a precursor sol of ferroelectric oxide (Sp) containing titanium, zirconium and lead as constitutional metal elements and simultaneously having photoreactive groups; and an organic polymer (A).

Hereinafter, the respective constitutional components are described.

First, the ferroelectric fine particle (B) is described. By introducing photoreactive groups into at least a part of the surface of the ferroelectric fine particle (B), the ferroelectric fine particle (Bp) is obtained.

The ferroelectric fine particle itself may be any particle consisting of any ferroelectric material known in the art, and typical examples of such ferroelectric materials include perovskite-structured lead zirconate titanate (PZT), barium titanate ($BaTiO_3$), lead titanate ($PbTiO_3$), and PLZT prepared by adding La to a solid solution of $PbZrO_3$ and $PbTiO_3$. Other examples include $LiNbO_3$, $LiTaO_3$, SbSl etc. For use as an actuator for an ink jet recording head, the ferroelectric fine particle consists preferably of lead zirconate titanate.

These ferroelectric fine particles can be produced by a process known in the art, such as sol-gel process from metal alkoxides or metal salts as the starting materials, co-precipitation method, hydrothermal method and spraying pyrolysis method.

In a preferable embodiment of the present invention, photoreactive groups are introduced into at least a part of the surface of the ferroelectric fine particle. That is, functional groups such as hydroxyl groups are present on the surface of the ferroelectric fine particle, so by reacting these functional groups with a compound having photoreactive groups, whereby the photoreactive groups can be introduced into the surface of the ferroelectric fine particle. The photoreactive groups are preferably introduced uniformly into the whole surface of the ferroelectric fine particle so that the fine particle has suitable photosensitivity.

The photoreactive groups are not particularly limited, and they are selected from e.g. (meth)acryloyl group and vinyl group.

The compound having photoreactive groups to be reacted with the ferroelectric fine particle includes e.g. silane coupling agents and titanium coupling agents having photoreactive groups. Examples of such silane coupling agents include divinyl dimethoxysilane, divinyl di-β-methoxyethoxysilane, vinyl triethoxysilane, vinyl tris-β-methoxyethoxysilane, γ-(meth)acryloxypropyl trimethoxysilane, γ-(meth)acryloxypropyl triethoxysilane and γ-(meth)acryloxypropyl methyl diethoxysilane. Among these, γ-(meth)acryloxypropyl trimethoxysilane, γ-(meth)acryloxypropyl triethoxysilane etc. are easily available. The titanium coupling agents include e.g. Plenact KR-55® (Ajinomoto Co., Inc.) etc.

The reaction of the silane coupling agent or the titanium coupling agent with the ferroelectric fine particle can be conducted usually by stirring both of them at room temperature in an alcohol such as methanol. An alkoxy group in the silane coupling agent or the titanium coupling agent is hydrolyzed to form a bond between Si or Ti and a hydroxyl residue on the surface of the ferroelectric fine particle.

Further, the compound having photoreactive groups to be reacted with the ferroelectric fine particle includes e.g. compounds with double bonds, such as (meth)acrylic acid and esters thereof. Specific examples include (meth)acrylic acid, methyl (meth)acrylate, ethyl (meth)acrylate, hydroxyethyl (meth)acrylate, hydroxypropyl (meth)acrylate etc.

The reaction of such (meth)acrylic acid or (meth)acrylate with the ferroelectric fine particle can be conducted usually by stirring both of them at room temperature in an alcohol such as methanol. A (meth)acryloyl group is introduced into a hydroxyl residue on the surface of the ferroelectric fine particle. Further, by reaction with an acid chloride such as (meth)acrylic acid chloride, (meth)acryloyl groups may be introduced into the ferroelectric fine particle.

Depending on the type and the average particle diameter (surface area per unit weight) of the ferroelectric fine particle and the type of the compound containing photoreactive groups, usually 1 to 10% preferably about 2 to 7% by weight of the compound containing photoreactive groups is reacted with the ferroelectric fine particle in the reaction of introducing the photoreactive groups into the ferroelectric fine particle. The effect of introducing the photoreactive groups tends to be low at a content of less than 1% by weight, while a sufficient amount of photoreactive groups can be introduced at a content of 10% by weight.

A silane coupling agent such as 3-methacryloxypropyl trimethoxysilane, and/or compounds such as (meth)acrylic acid and/or (meth)acrylate, are reacted preferably in an amount of about 2 to 7% by weight with e.g. fine PZT particles with an average diameter of 0.5 μm as determined by the BET method.

Further, photoreactive groups can also be introduced into the surface of the ferroelectric fine particle by surface graft polymerization or CVD.

In the present invention, the average diameter of the ferroelectric fine particles (BET method) is not particularly limited, but from the viewpoint of production of the piezoelectric thin film, the average diameter is preferably 5 nm to 10 μm, more preferably 10 nm to 5 μm.

The ferroelectric fine particles having photoreactive groups on the surface thereof can be dispersed at a high concentration in the photosensitive composition, and the fine particles themselves also have photosensitivity, so there is none of the problem of the reduction in sensitivity and in degrees of resolution by use of fine filler particles.

Now, the organic polymer (A) is described. The organic polymer (A) may be non-photosensitive but in consideration of the photosensitivity of the composition as a whole, at least a part of the organic polymer (A) is preferably a negative photosensitive organic polymer (Ap). In the negative photosensitive polymer, a portion exposed to light is rendered sparingly soluble or hydrophobic.

The photosensitive organic polymer (Ap) may be an organic polymer (Apa) which in itself has sufficient photosensitivity, or may be an organic polymer (Apb) which has sufficient photosensitivity by combination with a photosensitizer (A2). Usually, the latter organic polymer (Apb) which has sufficient photosensitivity by combination with the photosensitizer (A2) is often used. In the present specification, the organic polymer is intended to encompass both organic polymers and organic oligomers.

The organic polymer (Apa) which in itself has sufficient photosensitivity includes polymers containing azide groups and polymers (e.g. polyvinyl cinnamate) containing photodimerizable functional groups such as cinnamoyl group and cinnamylidene group.

The organic polymer (Apb) which has sufficient photosensitivity by combination with the photosensitizer (A2) can make use of various polymers with polar or nonpolar groups. A preferable photosensitive polymer contains polar groups such as hydroxyl group, alkoxy group, carboxyl group, ester group, ether group, carbonate group, amide group or N-substituted amide group (—NHC(O)—, >NC(O)— etc.), nitrile group, glycidyl group, and halogen atom. The photosensitive polymer may be a polymerizable oligomer or polymer having polymerizable groups such as (meth)acryloyl group, allyl group and vinyl group.

The polymer containing hydroxyl groups, and derivatives thereof, include e.g. polyvinyl alcohol-type polymer, polyvinyl acetal, hydroxyethyl cellulose, hydroxypropyl cellulose, ethylene-vinyl alcohol copolymer, phenol resin, novolak resin, methylol melamine, derivatives thereof (e.g., acetal derivatives and hexamethoxymethyl melamine).

The polymer containing carboxyl groups, and derivatives thereof, include e.g. homopolymers or copolymers containing polymerizable unsaturated carboxylic acids such as (meth)acrylic acid, maleic anhydride and itaconic acid, or esters thereof, and cellulose derivatives containing carboxyl groups (carboxymethyl cellulose or salts thereof) etc.

The polymer containing ester groups includes e.g. vinyl esters such as vinyl acetate; homo- or copolymers (e.g., polyvinyl acetate, ethylene-vinyl acetate copolymers, (meth) acrylic resin) containing monomers such as (meth)acrylate such as methyl methacrylate; saturated polyesters, unsaturated polyesters, vinyl ester resin, diallyl phthalate resin, cellulose esters etc.

The polymer containing ether groups includes e.g. polyalkylene oxide, polyoxyalkylene glycol, polyvinyl ether and silicon resin, and the polymer containing carbonate groups includes bisphenol A type polycarbonate etc.

The polymer containing amide groups or substituted amide groups includes polyoxazoline, N-acylated polyalkylene imine (i.e. a polymer corresponding to said polyoxazoline, for example a polymer containing N-acyl amino groups such as N-acetyl amino, N-polypropionyl amino group); polyvinyl pyrrolidone and derivatives thereof; polyurethane-type polymers; polyurea; nylon or polyamide-type polymers; polymers having burette linkages; polymers having allophanate linkages, and proteins such gelatin.

The monomer in said polyoxazoline includes 2-oxazoline, 2-substituted-2-oxazoline having a substituent group at the 2-position of an oxazoline ring (e.g., oxazolines having substituent groups including alkyl groups, haloalkyl groups such as dichloromethyl, trichloromethyl and pentafluoroethyl groups, phenyl groups, substituted phenyl groups such as 4-methylphenyl and 4-chlorophenyl, and alkoxycarbonyl groups). The polyoxazoline may be a homopolymer or a copolymer, and a single polyoxazoline or a mixture of two or more polyoxazolines may be used. Furthermore, the polyoxazoline may be a copolymer prepared by graft-polymerization of oxazoline onto another polymer.

The polyurethane-type polymer described above includes e.g. polyurethane formed by reacting a polyisocyanate (e.g., tolylene diisocyanate, hexamethylene diisocyanate, isophorone diisocyanate etc.) with a polyol (e.g., polyhydric alcohol such as ethylene glycol, propylene glycol, tetramethylene glycol and glycerin; polyether polyol such as diethylene glycol, polyethylene glycol, dipropylene glycol and polypropylene glycol; polyester polyol etc.).

The polyurea described above includes polymers formed by reacting a polyisocyanate with a polyamine (e.g., ethylene diamine, diethylene triamine).

Nylon or polyamide-type polymers include polyamides (nylon 66, nylon 6, nylon 610, nylon 611, nylon 612 or modified nylon thereof) using lactam components, dicarboxylate components and diamine components, poly(meth) acrylamide-type polymers, polyamino acids etc. The polyamino includes starburst dendrimer (D. A. Tomalia, et al., Polymer Journal, 17, 117 (1985)).

The polymer containing burette linkages described above includes polymers formed by reacting the polyisocyanate with a compound having urethane linkages, and the polymer having allophanate linkages includes polymers formed by reacting the polyisocyanate with a compound having urea linkages.

The polymer containing nitrile groups includes acrylonitrile-type polymers, and the polymer containing glycidyl groups includes e.g. epoxy resin and homo- or copolymers of glycidyl (meth)acrylate. The halogen-containing polymer includes e.g. polyvinyl chloride, vinyl chloride-vinyl acetate copolymers, vinylidene chloride-type polymers, chlorinated polypropylene etc.

The other organic polymers include e.g. polyolefin-type resin such as polyethylene, polypropylene, carboxyl-modified polyolefin; and styrene-type resin such as polystyrene, styrene-acrylonitrile copolymers and acrylonitrile-butadiene-styrene block copolymers. These may be used alone or in combination thereof.

The polymerizable oligomer having polymerizable groups includes polyvinyl phenol derivatives, epoxy (meth) acrylate (e.g., resin formed by reacting epoxy resin with (meth)acrylic acid), polyester (meth)acrylate, unsaturated polyester resin, polyurethane (meth)acrylate [e.g., a reaction product among a diol component (e.g. polyalkylene glycol and polyester diol), diisocyanate (e.g. 2,4-tolylene diisocyanate) and a hydroxyl group-containing polymerizable monomer (e.g. 2-hydroxyethyl methacrylate and N-methylol acrylamide); and an urethane reaction product between a hydroxy group- and polymerizable unsaturated group-containing compound (e.g. hydroxyethyl phthalyl (meth)acrylate, trimethylol propane diallyl ether etc.) and diisocyanate (e.g. xylylene isocyanate, 2,4-tolylene diisocyanate etc.)], polymerizable polyvinyl alcohol-type polymers (e.g., a reaction product between polyvinyl alcohol and N-methylol acrylamide), polyamide-type polymers [e.g., a prepolymer formed by reaction among a carboxyl group-containing ester formed by reacting a polyvalent carboxylic acid or an acid anhydride thereof (pyromellitic dianhydride etc.) with a hydroxyl group-containing polymerizable monomer (allyl alcohol etc.), a halogenating agent (thionyl chloride etc.) for converting a carboxyl group into an acid halide group as necessary, a diamine (p,p'-diaminodiphenyl ether etc.); a reaction product between a carboxyl group-containing polymer (poly(meth)acrylic acid or a maleic acid copolymer, an ethylene-maleic anhydride copolymer etc.) and an amino group-containing polymerizable monomer (allyl amine etc.)]; as well as silicone resin-type polymers.

The photosensitive polymers or oligomer (Apb) described above may be used alone or in combination thereof, and preferable examples include polyvinyl alcohol, hydroxyethyl cellulose, hydroxypropyl cellulose, nylon, and a homo- or copolymer of (meth)acrylic acid.

In the photosensitive composition of the present invention, the photopolymerizable monomer (A3) or oligomers thereof may be used as necessary in combination with the photosensitive polymers (Apa) and,(Apb). The photopolymerizable monomer (A3) or oligomers thereof include monofunctional or polyfunctional photopolymerizable compounds. Examples of photopolymerizable groups include e.g. (meth)acryloyl group, acrylamide group, allyl group, vinyl ether group, vinyl thioether group, vinyl amino group, glycidyl group and acetylenic unsaturated group.

The monofunctional photopolymerizable compounds include e.g. (meth)acrylic acid and alkyl (meth)acrylates such as methyl (meth)acrylate, butyl (meth)acrylate. 2-ethyl hexyl (meth)acrylate and lauryl (meth)methacrylate, cyclohexyl (meth)acrylate, benzyl (meth)acrylate, dimethyl aminoethyl (meth)acrylate, carbitol (meth)acrylate, 2-hydroxyethyl (meth)acrylate, 2-hydroxypropyl (meth) acrylate, glycidyl (meth)acrylate, (meth)acrylamide, N-methylol (meth)acrylamide, N-diacetone (meth) acrylamide, N,N'-methylene bis(meth)acrylamide, styrene, (meth)acrylonitrile, vinyl acetate, N-vinylpyrrolidone etc.

The polyfunctional photopolymerizable compounds include e.g. ethylene glycol di(meth)acrylate, diethylene glycol di(meth)acrylate, triethylene glycol di(meth)acrylate, polyethylene glycol di(meth)acrylate, polypropylene glycol di(meth)acrylate, 1,4-butanediol di(meth)acrylate, neopentyl glycol di(meth)acrylate, 1,6-hexane diol di(meth) acrylate, pentaerythritol di(meth)acrylate, pentaerythritol tri(meth)acrylate, trimethylol propene tri(meth)acrylate, pentaerythritol tetra(meth)acrylate etc. Further, it is also possible to use tetramethylol methane tetra(meth)acrylate, (meth)acrylic acid ester of 2,2,5,5-tetrahydroxymethyl cyclopentanone, (meth)acrylic acid ester of diglycidyl phthalate, (meth)acrylic acid ester of N,N,N',N'-tetrakis(β-hydroxyethyl) ethylene diamine, a reaction product of ester exchange between triglycerin and methyl acrylate, urethane-type (meth)acrylate, polyvalent unsaturated carboxylates, unsaturated acid amides, esters and metal salts with inorganic acids, monomers having acetylenic unsaturated groups and monomers having glycidyl groups.

The urethane-type acrylate includes e.g. products obtained by reacting a polyisocyanate (2,4-tolylene diisocyanate etc.) with a hydroxyl group-containing monomer (2-hydroxyethyl methacrylate etc.); reaction products produced by reacting a part of isocyanate groups in a polyisocyanate (2,4-tolylene diisocyanate etc.) with a hydroxyl group-containing monomer (2-hydroxyethyl methacrylate etc.) and then reacting the remaining isocyanate groups with an alkanol amine (triethanol amine etc.); and reaction products obtained by allowing a polyisocyanate (2,4-tolylene diisocyanate etc.) and a hydroxyl group-containing monomer (2-hydroxyethyl methacrylate etc.) to react with benzoin.

The polyvalent unsaturated carboxylates include e.g. polyfunctional monomers obtained by esterifying polyvalent carboxylic acids (phthalic acid, trimellitic acid, pyromellitic acid etc.) with hydroxyl group-containing monomers (allyl alcohol, 2-hydroxyethyl methacrylate etc.), for example diallyl phthalate, diallyl isophthalate, diallyl maleate, diallyl chlorendate, diallyl adipate, diallyl diglycolate, triallyl cyanurate, diethylene glycol bis-allyl carbonate, phthalic acid ester of 2-hydroxyethyl methacrylate and trimellitic acid ester of allyl alcohol, and compounds obtained by esterifying p-hydroxybenzoic acid with (meth)acryloyl chloride and then adding an epoxy-containing monomer (glycidyl methacrylate) to it.

The unsaturated acid amides include e.g. alkylene bis-acrylamides such as N,N'-methylene bis-acrylamide and hexamethylene bis-acrylamide, condensation products between polyamines and unsaturated acids, and products formed by reacting a hydroxyl group-containing unsaturated acid amide (e.g., N-methylol acrylamide) with a polyvalent carboxylic acid or polyvalent epoxy. Further reaction products in the presence of acid compounds such as N-methylol acrylamide; bis-acrylamides obtained by reacting acrylic acid chloride with oligomers obtained by reacting tetramethylene diamine with 1,3,3-trimethyl-1-acryloylaminomethyl-5-acryloylaminocyclohexane, hexahydro-1,3,5-triacryl-S-triazine, N-acryloylhydroxyethyl maleimide or ∈-caprolactam; and products produced by reacting N,N'-bis(∈-acryloylhydroxyethyl) aniline, N-methylol acrylamide and diethylene glycol diglycidyl ether.

The esters or metal salts with inorganic acids include e.g. zinc acrylate, alcohol-soluble polyamide resin, bis(2-hydroxyethyl methacrylate) ester of phosphoric acid.

The monomer containing acetylenic unsaturated groups includes 9-(ω-methoxybutenyl) anthraquinol synthesized from anthraquinone and 1-methoxybutene-3-yne, and urethane obtained by reacting 2,4-hexadiyne-1,6-diol with hexyl isocyanate.

The monomer containing glycidyl groups includes e.g. bisphenol A-diglycidyl ether.

The amount of the photopolymerizable monomer (A3) or its oligomers used can be selected in the range of e.g. 5 to 500 parts, preferably about 10 to 300 parts, relative to 100 parts by weight of the photosensitive polymer (Ap).

In the photosensitive composition of the present invention, various photosensitizers and photopolymerization initiators can be used as photosensitizer (A2), depending on the type of the photosensitive polymers (Apa) and (Apb).

Depending on the type of the photosensitive polymer, the photosensitizer (A2) can be selected from conventional photosensitizers and sensitizers, for example azide compounds, pyrylium salts, thiapyrylium salts, photo-dimerization sensitizers, photopolymerization initiators [for example, ketones (acetophenone, propiophenone, anthraquinone, thioxanthone, benzophenone or derivatives thereof), benzoin ether or derivatives thereof (for example, benzoin methyl ether), acyl phosphine oxide etc.].

In the present invention, compounds having a high coefficient of absorption are preferably used as the photosensitizer (A2). By the use of the photosensitizer having a high Coefficient of absorption, light absorption in the surface layer is larger than that in the lower layer. Consequently, photo-curing proceeds more in the surface layer than in the lower layer of the photosensitive layer, and by development the piezoelectric thin film having the specific vertical sectional shape of the present invention can be easily obtained. Examples of the photosensitizer having a high coefficient of absorption include azide compounds, benzophenone derivatives, benzoin ether derivatives and the like.

The amount of the photosensitizer (A2) used can be selected in the range of, for example, 0.1 to 20 parts by weight, preferably, 1 to 10 parts by weight with respect to 100 parts by weight of the photosensitive polymer (Ap).

In the method of the present invention, the reason why the piezoelectric thin film having the specific vertical sectional shape can be obtained is that the photo-curing proceeds more in the surface layer of the photosensitive layer than in the lower layer thereof by exposing the photosensitive layer to the light so as to form a surface insoluble layer. As the photosensitive layer includes more inorganic particles, the exposure light hardly reaches the lower layer of the photosensitive layer. Therefore, the photo-curing proceeds more in the surface layer than in the lower layer, thereby easily forming the surface insoluble layer. Furthermore, as described above, the use of the photosensitizer having a high coefficient of absorption can easily provide the surface insoluble layer. Thus, it is possible to provide the piezoelectric thin film having the specific vertical sectional shape by developing the photosensitive layer having the surface insoluble layer thereon.

The vertical sectional shape of the piezoelectric thin film can be adjusted by varying the forming degree of the surface insoluble layer. For example, the vertical sectional shape can be arbitrarily adjusted by adjusting the intensity or exposure time of the exposure light, or adjusting the photosensitive components (such as the kind or amount of monomer, the kind or amount of photosensitizer or the kind or amount of inorganic particle). Moreover, the shape can be adjusted by changing development conditions.

Now, the precursor sol of ferroelectric oxide (S) is described.

The "precursor" of ferroelectric oxide is obtained in the sol-gel process by polymerizing a metal species-containing compound (e.g. a metal alkoxide) as the starting material, and it refers to a precursor which will be converted into a substantially complete form of metal oxide.

The precursor sol of ferroelectric oxide (S) is preferably a precursor containing titanium, zirconium and lead as constitutional metal elements. This precursor sol can be synthesized in a method known in the art.

That is, a precursor sol of lea d zirconate titanate (PZT) can beobtained by e.g. hydrolysis and polymerization of titanium alkoxide, zirconium alkoxide, and lead alkoxide or lead acetate.

The titanium alkoxide includes e.g. tetra-normal propoxy titanium, tetra-isopropoxy titanium, tetra-normal butoxy titanium, tetra-isobutoxy titanium etc. The zirconium alkoxide includes e.g. tetra-normal propoxy zirconium, tetra-isopropoxy zirconium, tetra-normal butoxy zirconium, tetra-isobutoxy zirconium etc. The lead alkoxide includes di-normal propoxy lead, duisopropoxy lead, lead 2-aminoethoxy-acetate [$Pb(NH_2CH_2CH_2O)$ ($CH_3COO$)] etc.

The solvent for the hydrolysis-polymerization reaction can be used without any particular limitation insofar as starting materials such as alkoxide etc. and water subjected to hydrolysis are soluble therein and the solvent is not solidified at a temperature at which water is added. For example, alcohols such as methanol, ethanol and propanol can preferably be used as polar solvents. Further, nonpolar solvents such as toluene may be mixed therewith at a suitable proportion.

The hydrolysis-polymerization reaction can be conducted usually in the presence of a suitable acid catalyst at −100 to 200° C. depending on starting materials such as alkoxide etc. The precursor sol of ferroelectric oxide can be obtained in this manner.

The precursor sol of ferroelectric oxide (Sp) can be obtained by introducing photoreactive groups into the precursor sol of ferroelectric oxide (S). That is, since functional groups such as hydroxyl groups are present in said precursor, photoreactive groups can be introduced by reacting the functional groups with a compound having photoreactive groups.

The photoreactive groups are not particularly limited, and these are selected from e.g. (meth)acryloyl group, vinyl group etc.

The compound having photoreactive groups to be reacted with said precursor includes e.g. the same compound as used in the reaction of introducing photoreactive groups into the ferroelectric fine particle (B).

That is, a silane coupling agent and a titanium coupling agent having photoreactive groups can be mentioned. The reaction of the silane coupling agent or the titanium coupling agent with said precursor can be conducted usually at room temperature under stirring in an organic solvent, for example alcohol such as methanol. An alkoxy group in the silane coupling agent or the titanium coupling agent is hydrolyzed to form a bond between Si or Ti and a hydroxyl residue in said precursor.

The compound having photoreactive groups to be reacted with said precursor includes e.g. (meth)acrylic acid and esters thereof. The reaction of such (meth)acrylic acid or (meth)acrylate with said precursor can be conducted usually at room temperature under stirring in an organic solvent, for example alcohol such as methanol. A (meth)acryloyl group is introduced into a hydroxyl residue in said precursor.

In the reaction of introducing photoreactive groups into said precursor, the compound containing photoreactive groups in an amount of usually 1 to 30% by weight, preferably about 5 to 20% by weight in terms of solid content, depending on the composition of the precursor and the type of the compound containing photoreactive groups, is reacted with said precursor. The effect of introducing the photoreactive groups tends to be low at a content of less than 1% by weight, while a sufficient amount of photoreactive groups can be introduced at a content of 30% by weight.

For example, when 13.6 g tetra-isopropoxy titanium, 23.3 g of 85.7 weight-% isopropanol solution of tetra n-butoxy zirconium and 41.7 g tin acetate.3H2O are used, a silane coupling agent such as 3-methacryloxypropyl trimethoxysilane and/or compounds such as (meth)acrylic acid, (meth) acrylate etc. may be reacted in an amount of about 1.5 to 6.5 g.

The precursor sol of ferroelectric oxide (S) having photoreactive groups is obtained in this manner.

In said photosensitive composition (type I), the compounding ratio of the photosensitive organic polymer (Ap), the optionally used photosensitizer (A2) and/or the optionally used photopolymerizable monomer (A3), and the ferroelectric fine particles (B) may be determined in consideration of the use and required performance of the photosensitive composition, but from the viewpoint of improving a pattern shape after firing and adhesion to the substrate (lower electrode), the compounding ratio in terms of solid content is preferably $0.5<(B)/[(Ap)+(A2)+(A3)+(B)]<0.99$ and more preferably $0.8<(B)/[(Ap)+(A2)+(A3)+(B)]<0.95$.

Here, the ferroelectric fine particle (B) is the total of said ferroelectric fine particle (Bp) and the optionally used ferroelectric fine particle containing no photoreactive group.

If the compounding ratio is 0.5 or less, the sintering ability or adhesion to the substrate of the photosensitive composition tends to be decreased, whereas given a ratio of 0.99 or more, there is the tendency that photosensitive characteristics are decreased and degrees of resolution are worsened. Even if the ferroelectric fine particles are incorporated at such a high concentration into the photosensitive composition, their dispersibility is excellent.

Further, in said photosensitive composition (type I), the precursor sol of ferroelectric oxide (S) may also be contained as necessary.

When the precursor sol of ferroelectric oxide (S) having no photosensitivity is used, the amount of the precursor sol (S) incorporated is not particularly limited and may be used in such a range as not to deteriorate the photosensitive characteristics of the photosensitive composition. For example, the precursor sol of ferroelectric oxide (S) is used in an amount of about 1 to 10,000 parts in terms of oxide, preferably about 10 to 900 parts relative to 100 parts by weight of said ferroelectric fine particles (Bp).

In said photosensitive composition (type II), the compounding ratio of the precursor sol of ferroelectric oxide (Sp) to the organic polymer (A) may be determined in view of the use and required performance of the photosensitive composition, but from the viewpoint of improving a pattern shape after firing and adhesion to the substrate, the organic polymer (A) is contained in an amount of preferably 1 to 100 parts in terms of solid content, more preferably 10 to 50 parts relative to 100 parts by weight of the precursor sol of ferroelectric oxide (Sp).

Because the precursor sol of ferroelectric oxide (Sp) itself possesses photosensitivity, sufficient photo-patterning can be effected even when the amount of organic polymer (A) is low.

When the ferroelectric oxide fine particles (B) (preferably the fine particle (Bp) having photoreactive groups) are further contained as necessary in said photosensitive composition (type II), it is not particularly limited but preferable that 1 to 100 parts by weight of the organic polymer (A) and 1 to 10000 parts by weight of the ferroelectric oxide fine particles (B), both in terms of solid content, are contained relative to 100 parts by weight of the precursor sol of ferroelectric oxide (S), and the amount of the ferroelectric oxide fine particles (B) may be as low as 1 to 50 parts, preferably about 1 to 10 parts by weight. If the amount of the ferroelectric oxide fine particles (B) is low, low-temperature firing (e.g. at about 500 to 700° C.) is also feasible in the thin film manufacturing process. If the ferroelectric oxide fine particles (B) are those having no photosensitivity, their amount is preferably lower from the viewpoint of photo-patterning.

On the other hand, if the amount of the ferroelectric oxide fine particles (B) is large, higher firing temperature is necessary in the thin film manufacturing process, but a more thickened thin film is easily obtained.

In the present invention, the photosensitive composition can, as necessary, incorporate a wide variety of known additives such as a polymerization promoter, a dissolution promoter, an antioxidant, dyestuffs and pigments. Further, the photosensitive composition usually contains a solvent to improve operativeness such as coating properties. The solvent is selected as necessary from various solvents known in the art.

The photosensitive composition can be prepared by usual method, for example, by mixing the respective constitutional components for the composition, along with a suitable solvent (hydrophilic solvent such as alcohol). The respective constitutional components may be mixed all at once or in suitable order.

The photosensitive composition obtained in this manner is applied onto a lower electrode to form a photosensitive layer thereon. The lower electrode is usually subjected to patterning by screen printing etc. on a substrate such as zirconia. The substrate may previously be subjected to suitable surface treatment. For example, it may be surface-treated with a silane coupling agent etc.

The application method is not particularly limited and it is possible to use conventional coating techniques such as spin coating, dipping, casting, spray coating, die coating, screen printing or doctor blade coating. Among these, preferable techniques are spin coating, casting, spray coating, die coating and doctor blade coating.

After application, a photosensitive layer can be formed by drying the photosensitive composition as necessary to remove the solvent.

The formed photosensitive layer is irradiated or exposed to a light beam via a predetermined mask to conduct pattern light exposure. A halogen lamp, a high-pressure mercury lamp, a UV lamp and an excimer laser, radiation such as electron beam, X-radiation are used for the light beam. A light beam at a wavelength of about 100 to 500 nm, particularly UV rays are effective. The time for light exposure is arbitrary but is usually selected in the range of 0.1 second to 20 minutes, depending on the photosensitive characteristics of the photosensitive composition and the type of light beam. After light exposure, the photosensitive layer may be subjected to e.g. heat treatment at about 80 to 120° C. By such light exposure, portions exposed to light are photo-set and rendered sparingly soluble (water-resistant).

After pattern light exposure, the photosensitive layer is developed in a method known in the art, thereby forming a high-resolution negative pattern having the specific vertical sectional shape of the present invention. For the development, it is possible to use various developing solutions such as water, an aqueous alkali solution, an organic solvent or a mixture thereof, depending on the type of photosensitive composition. Furthermore, the development method is not particularly limited, and for example, a paddle (meniscus) techniques, a dipping, a spraying and the like may be used.

The pattern formed by development is heated for firing. This firing can be conducted at suitable temperatures., for example about 300 to 1400° C., preferably about 600 to 1200° C., depending on the type and amount of the ferroelectric fine particles and the ferroelectric-precursor sol incorporated and on the use of the ferroelectric thin film. Firing may be conducted in an arbitrary atmosphere such as inert gas atmosphere or oxygen-containing atmosphere (e.g. air) at normal pressure or reduced pressure. Usually, firing may be effected in air at rising temperature from room temperature to between about 300 and 1400° C. for 2 to 24 hours. Further, the temperature may be raised stepwise. By such firing, the organic components almost disappear and a dense piezoelectric thin film is obtained.

An upper electrode is formed in a usual manner by e.g. sputtering or vapor deposition on said piezoelectric thin film to form a piezoelectric thin film element.

The piezoelectric thin film element of the present invention has the characteristic structure described above so that displacement can be converted efficiently into vibration and accurate discharge of ink can be realized.

According to the production process of the present invention, the photosensitive composition capable of forming a ferroelectric thin film is subjected to patterning by photo-fabrication, so the upper and lower faces are made highly parallel to each other and simultaneously a thickened and uniformly shaped piezoelectric thin film can be formed.

Further, a piezoelectric thin film of fine pattern can be formed. These features, which cannot be achieved by patterning according to conventional screen printings, are great advantages of the present invention.

Further, use of the photosensitive composition comprising the ferroelectric fine particles (Bp) having photoreactive groups brings about additional advantages as follows:

The ferroelectric fine particles (Bp) can be dispersed at a high concentration in the photosensitive composition to give a thickened piezoelectric thin film.

Because the ferroelectric fine particles (Bp) themselves also have photosensitivity, the photosensitive composition is highly sensitive and achieves high degrees of resolution. In particular, when the ferroelectric fine particles (Bp) and the negative photosensitive organic polymer (Ap) are used, strong bonds between said fine particles and the photosensitive organic component are formed on only portions exposed to light, thus raising their dissolution contrast to portions not exposed to light, to improve degrees of resolution.

Further, use of the photosensitive composition comprising the precursor sol of ferroelectric oxide (Sp) having photoreactive groups brings about an additional advantage as follows:

Since the precursor sol of ferroelectric oxide (Sp) itself possesses negative-working photosensitivity, sufficient photo-patterning can be conducted even if the amount of the organic polymer (A) is low. In particular, when the precursor sol of ferroelectric oxide (Sp) and the negative photosensitive organic polymer (Ap) are used, strong bonds between said precursor and the photosensitive organic component are formed on only portions exposed to light, thus raising their dissolution contrast to portions not exposed to light, to improve degrees of resolution.

The piezoelectric thin film element according to the present invention is excellent in electric and mechanical characteristics, wherein the patterning of a high resolution can be applied in the producing processes, and further, it is suitable for an actuator for an ink jet-recording head. That is, when this piezoelectric thin film element is used as the actuator for the ink jet recording head, scattering in the displacement become small and the displacement can be efficiently converted into vibration, thus discharging the ink with accuracy. Additionally, the nozzles or the ink chambers can be finely arrayed, whereby the head can be provided at a high density.

The present invention also relates to the ink jet recording head provided with the piezoelectric thin film element or the piezoelectric thin film element produced by the above-described process as an actuator. The ink jet recording head also includes, for example, a multi-nozzle head in which a plurality of nozzles are arrayed in a linear or zigzag fashion.

MODES FOR CARRYING OUT THE INVENTION

Hereinafter, the present invention is described in more detail by reference to the Examples, which however are not intended to limit the present invention.

EXAMPLE 1

1. Preparation of an Organic Component/ Ferroelectric Fine Particle Mixture (Photosensitive Paste: Type I)

(1) Preparation of the Organic Component 2 g hydroxypropyl cellulose, 8 g pentaerythritol triacrylate, 0.5 g photopolymerization initiator Irgacure 1800 (Chibageigy) and 8 g ethyl cellosolve as a solvent were mixed and stirred to form a homogeneous and transparent mixture.

(2) Conferring of Photosensitivity on the Ferroelectric Fine Particles 0.6 g hydroxyethyl methacrylate and 40 g methanol were added to 20 g zirconia lead titanate Pb $(Zr, Ti)O_3$ from Sakai Chemical Industry Co., Ltd. (PZT-HQ® with an average particle diameter of 0.5 $\mu$m as determined by the BET method) as the ferroelectric fine particles, and the mixture was stirred at room temperature for 2 hours. Thereafter, the mixture was dried under reduced pressure at 40° C. to remove the methanol, and photosensitive groups were added to the surface of the ferroelectric fine particles.

An infrared absorption spectrum of the resulting ferroelectric fine particles was taken in an FT/IR-7000 type. Fourier transform infrared measuring unit (Nippon Bunko Kogyo Co., Ltd.). Each absorption of a carbonyl group (—C=O) near 1700 $cm^{-1}$, a methyl group near 1300 $cm^{-1}$ and a vinyl group ($CH_2$=C<) near 1000 $cm^{-1}$ was observed, and it was confirmed that methacryloxy groups were introduced into the PZT particles.

(3) Preparation of an Organic Component/Ferroelectric Fine Particle Mixture (Photosensitive Paste)

9 g of the ferroelectric fine particle in item (2) above was mixed at room temperature with 1.5 g of the organic component solution in item (1) above to prepare a photosensitive paste.

2. Patterning of the Photosensitive Paste (1) Application

A platinum paste of 5 $\mu$m in thickness was formed by screen printing on a 10 mm×10 mm zirconia substrate, and the photosensitive paste prepared in item 1 above was coated thereon with a doctor blade. When it was dried at 70° C. for 30 minutes, its thickness was 13 $\mu$m.

(2) Light Exposure and Development

The photosensitive paste film containing ferroelectric fine particles prepared in item (1) above was exposed to light for 20 seconds via a test mask (line width: 50 $\mu$m) in Mask A Liner M-2L light exposure unit (Mikasa Co., Ltd.) with a 250 W ultrahigh-pressure mercury lamp. The paste film after light exposure was developed by spraying methanol for 15 seconds. The reduction of the film by development was hardly observed under an electron microscope.

3. Formation of a Ferroelectric Thin Film by Firing of the Patterned Film

The thin film containing ferroelectric fine particles after development was fired in air at an increasing temperature from room temperature to 400° C. for 6 hours and further to 1000° C. for 1 hour to give a ferroelectric thin film of very good denseness. When an infrared absorption spectrum of the film after firing was observed, an absorption originating in the organic components was hardly observed, and it was thus confirmed that the film was converted into inorganic matter (ceramics) almost completely. Further, the thickness of the film after firing as determined by observation under an electron microscope was about 12 $\mu$m.

Further, when the sectional shape of this thin film at a portion with a line width of 50 $\mu$m was observed under an electron microscope, it was found that in view of FIG. 2, the length of the upper side $Lu_1$=50 $\mu$m, the length of the lower side $Lb_1$=35 $\mu$m, $\theta l_1$=118°, and $\theta r_1$=118°. Measurement of the film thickness at 5 points with a surface roughness measuring device (Surfoom 480A, manufactured by Tokyo Seimitsu Co., Ltd.) indicated that the maximum thickness of the film was 12.3 $\mu$m, the minimum thickness was 11.9 $\mu$m, and the average thickness was 12.1 $\mu$m.

This shape can be changed into various forms by changing the paste composition and development conditions. Further, the degree of resolution can be changed variously by changing the line width of the test mask at the time of light exposure. Exposure to light through the test mask with a line width of 10 $\mu$m, development and firing gave a PZT thin film with a degree of resolution of 10 $\mu$m having the same sectional shape as described above.

4. Performance of a Piezoelectric Element

An upper electrode of Pt (platinum) was formed by sputtering on the resulting piezoelectric thin film. The thickness of the electrode was 0.5 $\mu$m.

With this piezoelectric element, an ink jet recording head having the configuration (the width $C_1$ and length $C_2$ of the ink chamber are 50 $\mu$m and 1750 $\mu$m, respectively) shown in FIGS. 4 and 5 was fabricated, so that ink was discharged. As a result, the ink could be discharged at an ink discharging speed of 9.8 m/sec under the driving conditions of a driving voltage being 40 V and a frequency being 2 kHz.

Subsequently, an ink jet recording head having 50 nozzles was fabricated, and then, the ink was discharged under the conditions of a driving voltage being 20 V and a frequency being 2 kHz. An average ink discharging speed of the nozzles was measured. Variations among the nozzles were evaluated based on the obtained average ink discharging speed, resulting in 2.8% or less.

EXAMPLE 2

Production Example of Thin Film Using No Ferroelectric Fine Particle

1. Preparation of an Organic Component/ Ferroelectric Oxide-precursor Sol Mixture (Photosensitive Paste: Type II)

(1) Preparation of the Organic Component 2 g nylon copolymer (CM8000, Toray Industries Inc.) was dissolved in 8 g methanol at 40° C. and cooled to room temperature, and then 0.12 g benzoin methyl ether and 0.4 g methylene bis-acrylamide were added thereto and stirred to form a homogeneous and transparent mixture.

(2) Preparation of a Ferroelectric Oxide-precursor Sol

Twenty-three point three grams (85.7% by weight) of an isopropanol solution of tetra-n-butoxy zirconium and 2.6 g of acetyl acetone were mixed with each other, and then, refluxed for 2 hours (a solution "a").

Separately, 13.64 g tetra-isopropoxy titanium, 9.61 g acetyl acetone and 3.65 g trimethylene glycol were mixed. This mixture was added to said solution "a" and refluxed for 2 hours (solution "b").

Separately, 41.73 g lead acetate.3H$_2$O and 38.2 g trimethylene glycol were mixed and refluxed for 2 hours.

This mixture was added to said solution "b" and further refluxed for 5 hours.

The resulting solution was concentrated at 80 to 85° C. in an evaporator to give a precursor sol solution at a concentration of 35% by weight.

0.175 g acrylic acid was added to 5 g of this precursor sol solution and stirred at room temperature for 2 hours. In this manner, photosensitive groups were introduced into the ferroelectric oxide-precursor.

An infrared absorption spectrum of the resulting precursor sol was taken in an FT/IR-7000 type Fourier transform infrared measuring unit (Nippon Bunko Kogyo Co., Ltd.). The absorption of a carbonyl group (—C=O) near 1700 cm$^{-1}$ was observed and it was confirmed that acryloxy groups were introduced into the precursor sol.

(3) Preparation of an Organic Component/Ferroelectric Oxide-precursor Sol Mixture (Photosensitive Paste)

5 g of the organic component solution in item (1) above was mixed with 25 g of the precursor sol solution in item (2) above to prepare a photosensitive paste.

2. Patterning of the Photosensitive Paste (1) Application

Platinum of 1 μm in thickness was formed by sputtering on a 10 mm×10 mm zirconia substrate, and the photosensitive paste prepared in item 1 above was coated thereon by spray coating. When it was dried at 70° C. for 30 minutes, its thickness was 15 μm.

(2) Light Exposure and Development

The photosensitive paste film prepared in item (1) above was exposed to light for 30 seconds via a test mask with various line widths in Mask A Liner M-2L light exposure unit with a 250 W ultrahigh-pressure mercury lamp. Thereafter, the paste film was developed by spraying methanol.

The reduction of this film by development was hardly observed under an electron microscope, and a degree of resolution of 10 μm was confirmed.

3. Formation of a Ferroelectric Thin Film by Firing of the Patterned Film

The thin film after development was fired in air at an increasing temperature from room temperature to 400° C. for 7 hours and further to 90° C. for 1 hour to give a ferroelectric thin film of very good denseness. When an infrared absorption spectrum of the film after firing was observed, an absorption originating in the organic components was hardly observed, and it was thus confirmed that the film was made inorganic matter (ceramics) almost completely. Further, the thickness of the film after firing, as determined by observation under an electron microscope, was about 3 μm.

Further, when the sectional shape of this thin film at a portion with a line width of 50 μm was observed by an electronic microscope, the length Lu$_1$ of the upper side was 50 μm, the length Lb$_1$ of the lower side was 48 μm, θl$_1$ was 105° and θr$_1$ was 111°, in reference to FIG. 2. Measurement of the film thickness at five points by a surface roughness measuring device (Surfcom 480A, manufactured by Tokyo Seimitsu Co., Ltd.) indicated that the maximum thickness of the film was 3.2 μm, the minimum thickness thereof was 2.9 μm and the average thickness thereof was 3.1 μm.

4. Performance of a Piezoelectric Element

An upper electrode of Pt (platinum) was formed by sputtering on the resulting piezoelectric thin film. The thickness of the electrode was 1.0 μm. When it was used as the piezoelectric element to discharge an ink, sufficient discharge power was obtained.

EXAMPLE 3

Production Example of Thin Film Using Ferroelectric Fine Particles

1. Preparation of an Organic Component/Ferroelectric Fine Particle/Ferroelectric Oxide-precursor Sol Mixture (Photosensitive Paste: Type II)

(1) Preparation of the Organic Component 2 g nylon copolymer (CM8000, Toray Industries Inc.) was dissolved in 8 g methanol at 40° C. and cooled to room temperature, and then 0.12 g benzoin methyl ether and 0.4 g methylene bis-acrylamide were added thereto and stirred to form a homogeneous and transparent mixture.

(2) Conferring of Photosensitivity on the Ferroelectric Fine Particles 0.6 g hydroxyethyl methacrylate and 40 g methanol were added to 20 g zirconia lead titanate Pb (Zr, Ti)O$_3$ from Sakai Chemical Industry Co., Ltd. (PZT-LQ® with an average particle diameter of 0.5 μm as determined by the BET method) as the ferroelectric fine particles, and the mixture was stirred at room temperature for 2 hours. Thereafter, the mixture was dried under reduced pressure at 40° C. to remove the methanol, and photosensitive groups were added to the surface of the ferroelectric fine particles.

An infrared absorption spectrum of the resulting ferroelectric fine particles was taken in an FT/IR-7000 type Fourier transform infrared measuring unit (Nippon Bunko Kogyo Co., Ltd.). Each absorption of a carbonyl group (—C=O) near 1700 cm$^{-1}$, a methyl group near 1300 cm$^{-1}$ and a vinyl group (CH$_2$=C<) near 1000 cm$^{-1}$ was observed, and it was confirmed that methacryloxy groups were introduced into the PZT particles.

(3) Preparation of an Organic Component/Ferroelectric Fine Particle/Ferroelectric Oxide-precursor Sol Mixture (Photosensitive Paste)

5 g of the organic component solution in item (1) above and 3 g of the ferroelectric fine particles in item (2) above were mixed at room temperature with 25 g of the precursor sol solution in item 1. (2) in Example 2 to prepare a photosensitive paste.

2. Patterning of the Photosensitive Paste (1) Application

Platinum of 1 μm in thickness was formed by sputtering on a 10 mm×10 mm zirconia substrate, and the photosensitive paste prepared in item 1 above was coated thereon with a doctor blade. When it was dried at 70° C. for 30 minutes, its thickness was 17 μm.

(2) Light Exposure and Development

The photosensitive paste film containing ferroelectric fine particles prepared in item (1) above was exposed to light for 30 seconds via a test mask having various line widths in Mask A Liner M-2L light exposure unit with a 250 W ultrahigh-pressure mercury lamp. Thereafter, the paste film was developed by spraying methanol. The reduction of the film by this development was hardly observed under an electron microscope, and a degree of resolution of 10 µm was confirmed.

3. Formation of a Ferroelectric Thin Film by Firing of the Patterned Film

The thin film containing ferroelectric fine particles after development was fired in air at an increasing temperature from room temperature to 400° C. for 7 hours and further to 1100° C. for 1 hour to give a ferroelectric thin film of very good denseness. When an infrared absorption spectrum of the film after firing was observed, an absorption originating in the organic components was hardly observed, and it was thus confirmed that the film was converted into inorganic matter (ceramics) almost completely. Further, the thickness of the film after firing as determined by observation under an electron microscope was about 8 µm.

Further, when the sectional shape of this thin film at a portion with a line width of 50 µm was observed by an electronic microscope, the length $Lu_1$ of the upper side was 50 µm, the length $Lb_1$ of the lower side was 45 µm, $\theta l_1$ was 108° and $\theta r_1$ was 106°, in reference to FIG. 2. Measurement of the film thickness at five points by the surface roughness measuring device (Surfcom 480A, manufactured by Tokyo Seimitsu Co., Ltd.) indicated that the maximum thickness of the film was 8.3 µm, the minimum thickness thereof was 7.8 µm and the average thickness thereof was 8.1 µm.

4. Performance of the Piezoelectric Element

An upper electrode of Pt (platinum) was formed by sputtering on the resultant piezoelectric thin film. The thickness of the electrode was 1.0 µm. When it was used as the piezoelectric element to discharge an ink, sufficient discharge power was obtained.

Referring to FIG. 4 and FIG. 5, description will be given below of specific embodiments in the case where the piezoelectric thin film element according to the present invention is applied to the ink jet recording head.

EXAMPLES 4 to 18

In Examples 4 to 18 were fabricated ink jet recording heads in which the dimensions and the angles, i.e., the length $Lb_1$ in the width direction at the bottom surface of the piezoelectric thin film (103), the length $Lu_1$ in the width direction at the upper surface of the thin film (103), the length $C_1$ in the width direction of the ink chamber (106), the length $C_2$ in the longitudinal direction of the ink chamber (106), the length $Eu_1$ in the width direction of the upper electrode (104), and the angles $\theta l_1$ and $\theta r_1$ defined between the lower side and the respective lateral sides in the section of the thin film (103) were varied as illustrated in Table 1 and Table 2.

Ink discharge experiment was carried out by varying the driving voltage and the frequency by the use of these heads. Ink discharging speeds (m/sec) under the conditions of the driving voltage being 30 V and 3 kHz are shown in Table 1 and Table 2.

In Examples 4 to 13, the length $C_1$ was fixed to 200 µm while the length $Lb_1$ was varied, thereby a ratio $Lb_1/C_1$ of both the lengths was varied within the range of 0.45 to 0.98. In each of Examples 4 to 13, a discharging speed of 8.6 m/sec or more could be obtained. This was a sufficient discharging speed in the ink jet recording head. When the ratio $Lb_1/C_1$ was varied within the range of 0.50 to 0.95, a discharging speed of 9.2 m/sec or more could be obtained. Moreover, when the ratio $Lb_1/C_1$ was varied within the range of 0.65 to 0.90, a more excellent discharging speed of 9.7 m/sec or more could be obtained.

In Examples 14 to 18, the length $C_1$ was fixed to 100 µm and the length $Lu_1$ was fixed to 114 µm while the length $C_2$ was varied, thereby a ratio $C_2/Lu_1$ of both the lengths was varied within the range of 4.4 to 52.6. In each of Examples 14 to 18, a discharging speed of 7.6 m/sec or more could be obtained under the conditions of 30 V and 3 kHz.

Furthermore, in the ink jet recording head in each of Examples 14 to 18, the driving frequency was gradually increased from 3 kHz to 50 kHz, so that the upper limit of the driving frequency at which each of the heads could discharge the ink was confirmed.

In Example 14 in which the ratio $C_2/Lu_1$ was 52.6, a discharging speed of 7.8 m/sec could be obtained under the driving conditions of 30 V and 3 kHz, and continuous discharge could be performed. However, at the time when the driving frequency reached 10 kHz, the discharge could not be performed, thereby making the continuous discharge difficult. This seems because the ink supply to the ink chamber could not follow the ink discharge.

In Example 15 in which the ratio $C_2/Lu_1$ was 35.1, a discharging speed of 8.3 m/sec could be obtained under the conditions of 30 V and 3 kHz, and the continuous discharge could be performed. However, at the time only when the driving frequency reached 50 kHz, the discharge could not be performed, thereby making the continuous discharge difficult.

In Examples 16 to 18, the continuous discharge could be performed without any problem even at the driving frequency of 50 kHz.

Furthermore, as illustrated in Table 2, the size of one ink droplet was reduced with the decreased ratio $C_2/Lu_1$ under the driving conditions of 30 V and 3 kHz. In Example 18, the average size of one ink droplet was smaller than 5 pl under this condition. Even if the driving condition was varied, droplets of 8 pl or more could not be discharged. Consequently, it was difficult to widely control the size of the droplet.

Next, explanation will be made on ink jet recording heads, as comparative examples, produced by the conventional screen printing or the like.

COMPARATIVE EXAMPLE 1

A piezoelectric thin film having a thickness (a maximum thickness) at the center being 20 µm was formed by a screen printing. The piezoelectric thin film had a sectional shape in which an acute angle was defined between a lower side and a lateral side, as illustrated in FIG. 6. An upper electrode was formed on the piezoelectric thin film by sputtering, thereby providing an ink jet recording head having a width $C_1$ of an ink chamber being 200 µm and a length $C_2$ in a longitudinal direction of the ink chamber being 2 mm. As a result of discharge experiment by using the fabricated head, an ink discharging speed was no more than 5.7 m/sec, or was not sufficient, under the driving conditions of 30 V and 3 kHz.

COMPARATIVE EXAMPLE 2

A PZT film having a thickness of 10 µm was formed under such a condition that an angle defined between a lower side and each of lateral sides in a vertical section with respect to a substrate of a piezoelectric thin film becomes 90° (that is, the shape shown in FIG. 7). An upper electrode was formed on the PZT film by sputtering, thereby providing an ink jet recording head having 50 nozzles and ink chambers, each having a width $C_1$ being 200 μm and a length $C_2$ in a longitudinal direction being 2 mm. An average ink discharging speed of the each nozzle was measured by using the fabricated head under the driving conditions of 30 V and 3 kHz. A variation between the nozzles evaluated based on the obtained values was 17%. This was because a displacement of the piezoelectric thin film element with respect to each of the ink chambers was varied. In order to discharge the ink under a constant condition, it is necessary to correct the driving condition for each of the ink chambers. This is not preferable.

With respect to the heads in Examples 4 to 7, ink jet recording heads having 50 nozzles were fabricated in the same manner. An average ink discharging speed of the each nozzle was measured by using the fabricated head under the driving conditions of 30 V and 3 kHz. A variation between the nozzles evaluated based on the obtained values was 2.8% or less.

COMPARATIVE EXAMPLE 3

In Comparative Example 3, there was fabricated an ink jet recording head having $\theta l_1$ being 153° and $\theta r_1$ being 152°, as shown in FIG. 5. Continuous discharge experiments were carried out under the driving conditions of 30 V and 2 kHz by using the heads in Examples 4 to 7 and Comparative Example 3. As a result, the discharge could be no longer performed when the discharge was repeated over $10^6$ times in Comparative Example 3. An analysis of this cause revealed that a crack was generated at the piezoelectric thin film and the film was partly peeled off. In contrast, in the heads in Examples 4 to 7, the same performance could be maintained without any change in discharging speed as that at the beginning even in the discharge in excess of $10^8$ times.

With respect to Comparative Examples 1 to 3, Table 1 shows the ink discharging speeds (m/sec) under the conditions of the voltage being 30 V and 3 kHz.

The present invention can be embodied in various modifications and alterations without departing from the spirit or scope. Consequently, the above-described embodiments are merely illustrations in every sense, and therefore, are not interpreted in the limitative sense. Furthermore, all of variations pertaining to the equivalent scope of the claims are encompassed within the scope of the present invention.

INDUSTRIAL APPLICABILITY

According to the present invention, there is provided the piezoelectric thin film element including the piezoelectric thin film having the specific shape. Furthermore, according to the present invention, there is provided the process for producing the piezoelectric thin film element including the piezoelectric thin film having the specific shape by using the photosensitive composition capable of forming the ferroelectric thin film.

The piezoelectric thin film element according to the present invention is suitable for, in particular, an actuator for an ink jet recording head.

TABLE 1

|  | $Lb_1$ (μm) | $C_1$ (μm) | $Eu_1$ (μm) | $Lu_1$ (μm) | $C_2$ (μm) | $Lb_1/C_1$ | $C_2/Lu_1$ | $\theta l_1$ (°) | $\theta r_1$ (°) | Discharging Speed (m/sec) |
|---|---|---|---|---|---|---|---|---|---|---|
| Example 4 | 160 | 200 | 160 | 162 | 2000 | 0.80 | 12.4 | 95 | 95 | 10.2 |
| Example 5 | 160 | 200 | 165 | 169 | 2000 | 0.80 | 11.8 | 115 | 114 | 10.5 |
| Example 6 | 160 | 200 | 165 | 171 | 2000 | 0.80 | 11.7 | 119 | 119 | 10.3 |
| Example 7 | 160 | 200 | 180 | 192 | 2000 | 0.80 | 10.4 | 148 | 148 | 9.7 |
| Example 8 | 90 | 200 | 100 | 104 | 2000 | 0.45 | 19.2 | 125 | 125 | 8.7 |
| Example 9 | 100 | 200 | 108 | 114 | 2000 | 0.50 | 17.5 | 125 | 124 | 9.2 |
| Example 10 | 132 | 200 | 140 | 146 | 2000 | 0.66 | 13.7 | 125 | 125 | 9.7 |
| Example 11 | 180 | 200 | 184 | 194 | 2000 | 0.90 | 10.3 | 126 | 125 | 9.7 |
| Example 12 | 188 | 200 | 190 | 202 | 2000 | 0.94 | 9.9 | 126 | 125 | 9.3 |
| Example 13 | 196 | 200 | 200 | 211 | 2000 | 0.98 | 9.5 | 127 | 126 | 8.6 |
| Comparative Example 1 | 160 | 200 | 110 | — | 2000 | 0.80 | — | 30 | 29 | 5.7 |
| Comparative Example 2 | 160 | 200 | 150 | 160 | 2000 | 0.80 | 12.5 | 90 | 90 | 8.3 |
| Comparative Example 3 | 160 | 200 | 180 | 198 | 2000 | 0.80 | 10.1 | 153 | 152 | 7.3 |

TABLE 2

|  | $Lb_1$ (μm) | $C_1$ (μm) | $Eu_1$ (μm) | $Lu_1$ (μm) | $C_2$ (μm) | $Lb_1/C_1$ | $C_2/Lu_1$ | $\theta l_1$ (°) | $\theta r_1$ (°) | Discharging Speed (m/sec) | Droplet Volume (pl) |
|---|---|---|---|---|---|---|---|---|---|---|---|
| Example 14 | 100 | 100 | 105 | 114 | 6000 | 1.00 | 52.6 | 125 | 125 | 7.8 | 30 |
| Example 15 | 100 | 100 | 105 | 114 | 4000 | 1.00 | 35.1 | 125 | 125 | 8.3 | 25 |
| Example 16 | 100 | 100 | 105 | 114 | 3000 | 1.00 | 26.3 | 125 | 125 | 8.7 | 22 |
| Example 17 | 100 | 100 | 105 | 114 | 750 | 1.00 | 6.6 | 125 | 125 | 8.4 | 10 |
| Example 18 | 100 | 100 | 105 | 114 | 500 | 1.00 | 4.4 | 125 | 125 | 7.6 | 4 |

What is claimed is:

1. A piezoelectric thin film element comprising a substrate, a lower electrode formed on said substrate, a piezoelectric thin film formed on said lower electrode and an upper electrode formed on said piezoelectric thin film, wherein a vertical lateral sectional shape and/or a vertical longitudinal sectional shape of said piezoelectric thin film with respect to a plane surface of said substrate is a quadrilateral having upper and lower sides mutually facing and substantially parallel to each other and both lateral sides, and angles $\theta l$ and $\theta r$ defined between the lower side and the respective lateral sides are:

$90° < \theta l < 150°$ and/or $90° < \theta r < 150°$.

2. The piezoelectric thin film element according to claim 1, wherein the thickness of said piezoelectric thin film is 1 $\mu m$ to 25 $\mu m$.

3. The piezoelectric thin film element according to claim 1, wherein the length of the upper side Lu and the length of the lower side Lb are in the relationship Lu>Lb.

4. The piezoelectric thin film element according to claim 1, wherein the difference between the maximum thickness of said piezoelectric thin film at any point on the piezoelectric film is less than 1 $\mu m$.

5. The piezoelectric thin film element according to claim 1, wherein said piezoelectric thin film comprises mainly lead zirconate titanate.

6. An ink jet recording head comprising:

at least one of the piezoelectric thin film element according to claim 1;

at least one ink chamber; and at least one ink discharging nozzle.

7. The ink jet recording head according to claim 6, wherein assuming that $Lb_1$ represents a length in a width direction of a bottom surface of said piezoelectric thin film and $C_1$ represents a length in a width direction of said ink chamber, the relationship below is established:

$0.50\ C_1 \leq Lb_1 \leq 0.95\ C_1$.

8. The ink jet recording head according to claim 7, wherein the relationship below is established:

$0.65\ C_1 \leq Lb_1 \leq 0.90\ C_1$.

9. The ink jet recording head according to claim 6, wherein assuming that $Lu_1$ represents a length in a width direction of an upper surface of said piezoelectric thin film and $C_2$ represents a length in a longitudinal direction of said ink chamber, the relationship below is established:

$5 \leq C_2/Lu_1 \leq 50$.

10. The ink jet recording head according to claim 9, wherein the relationship below is established:

$8 \leq C_2/Lu_1 \leq 35$.

11. The ink jet recording head according to claim 6, wherein assuming that $C_1$ represents a length in a width direction of said ink chamber, the relationship below is established:

$20\ \mu m \leq C_1 \leq 500\ \mu m$.

12. The ink jet recording head according to claim 11, wherein the relationship below is established:

$30\ \mu m \leq C_1 \leq 300\ \mu m$.

13. The ink jet recording head according to claim 6, wherein assuming that $Lb_1$ represents a length in a width direction of a bottom surface of said piezoelectric thin film, $Eu_1$ represents a length in a width direction of said upper electrode and $Lu_1$ represents a length in a width direction of an upper surface of said piezoelectric thin film, the relationship below is established:

$Lb_1 < Eu_1 < Lu_1$.

14. The ink jet recording head according to claim 6, wherein assuming that $Lb_1$ represents a length in a width direction of a bottom surface of said piezoelectric thin film, $Lu_1$ represents a length in a width direction of an upper surface of said piezoelectric thin film, $C_1$ represents a length in a width direction of said ink chamber, $C_2$ represents a length in a longitudinal direction of said ink chamber and $Eu_1$ represents a length in a width direction of said upper electrode, the relationships below are established:

$0.50\ C_1 < Lb_1 \leq 0.95\ C_1$;

$5 \leq C_2/Lu_1 \leq 50$; and $Lb_1 < Eu_1 < Lu_1$.

15. A process for producing piezoelectric thin film element comprising a substrate, a lower electrode formed on said substrate, a piezoelectric thin film formed on said lower electrode and an upper electrode formed on said piezoelectric thin film, wherein a vertical lateral sectional shape and/or a vertical longitudinal sectional shape of said piezoelectric thin film with respect to a plane surface of said substrate is a quadrilateral having upper and lower sides mutually facing and substantially parallel to each other and both lateral sides, and angles $\theta l$ or $\theta r$ defined between the lower side and the respective lateral sides are:

$90° < \theta l < 150°$ and/or $90° < \theta r < 150°$, which comprises:

applying a photosensitive composition capable of forming a ferroelectric thin film onto the lower electrode to form a photosensitive layer; and subjecting the photosensitive layer to light exposure of a predetermined pattern, followed by development and firing, thereby forming the predetermined pattern.

16. The process for producing a piezoelectric thin film element according to claim 15, wherein the length of the upper side Lu and the length of the lower side Lb are in the relationship Lu>Lb.

17. The process for producing a piezoelectric thin film element according to claim 15, wherein the photosensitive composition capable of forming a ferroelectric thin film comprises at least:

an organic polymer (A); and a ferroelectric fine particle (Bp) having photoreactive groups on at least a part of the surface thereof.

18. The process for producing a piezoelectric thin film element according to claim 17, wherein the photosensitive composition capable of forming a ferroelectric thin film further comprises a ferroelectric fine particle having no photoreactive group.

19. The process for producing a piezoelectric thin film element according to claim 17, wherein said ferroelectric fine particle (Bp) and/or said ferroelectric fine particle having no photoreactive group comprise mainly lead zirconate titanate.

20. The process for producing a piezoelectric thin film element according to claim 17, wherein use is made of a photosensitive composition comprising said organic polymer (A), at least apart of which is a photosensitive organic polymer (Ap), and further comprising a photosensitizer (A2) and/or a photopolymerizable monomer (A3) as necessary.

21. The process for producing a piezoelectric thin film element according to claim 20, wherein use is made of a photosensitive composition comprising the photosensitive organic polymer (Ap), the photosensitizer (A2) and/or the photopolymerizable monomer (A3) as necessary, and the ferroelectric fine particle (B) [the total of said ferroelectric fine particle (Bp) and said ferroelectric fine particle having no photoreactive group] at a compounding ratio of 0.5<(B)/[(Ap)+(A2)+(A3)+(B)]<0.99 in terms of the ratio of solid contents by weight.

22. The process for producing a piezoelectric thin film element according to claim 20, wherein a compound selected from azide compounds, benzophenone derivatives, benzoin ether derivatives and thioxanthone derivatives is used as photosensitizer (A2).

23. The process for producing a piezoelectric thin film element according to claim 15, wherein the photosensitive composition capable of forming a ferroelectric thin film comprises at least:

a precursor sol of ferroelectric oxide (Sp) containing titanium, zirconium and lead as constitutional metal elements and simultaneously having photoreactive groups; and an organic polymer (A).

24. The process for producing a piezoelectric thin film element according to claim 23, wherein use is made of a photosensitive composition comprising said organic polymer (A), at least a part of which is a photosensitive organic polymer (Ap) and further comprising a photosensitizer (A2) and/or a photopolymerizable monomer (A3) as necessary.

25. The process for producing a piezoelectric thin film element according to claim 23, wherein use is made of a photosensitive composition further comprising a ferroelectric oxide fine particle (B).

26. The process for producing a piezoelectric thin film element according to claim 25, wherein the ferroelectric oxide fine particle (B) is a fine particle (Bp) having photoreactive groups on at least a part of the surface thereof.

27. The process for producing a piezoelectric thin film element according to claim 25, wherein the ferroelectric oxide fine particle (B) comprises mainly lead zirconate titanate.

28. The process for producing a piezoelectric thin film element according to claim 25, wherein use is made of a photosensitive composition comprising, in terms of solid content, 1 to 100 parts by weight of the organic polymer (A) and/or 1 to 10,000 parts by weight of the ferroelectric oxide fine particle (B) relative to 100 parts by weight of the precursor sol of ferroelectric oxide (Sp).

29. The process for producing a piezoelectric thin film element according to claim 23, wherein use is made of a photosensitive composition comprising, in terms of solid content, 1 to 100 parts by weight of the organic polymer (A) relative to 100 parts by weight of the precursor sol of ferroelectric oxide (Sp).

30. The process for producing a piezoelectric thin film element according to claim 15, wherein the application of the photosensitive composition onto the lower electrode is conducted by spin coating, casting, spray coating, a doctor blade coating or die coating.

\* \* \* \* \*

UNITED STATES PATENT AND TRADEMARK OFFICE
CERTIFICATE OF CORRECTION

| | | |
|---|---|---|
| PATENT NO. | : 6,478,412 B1 | Page 1 of 1 |
| DATED | : November 12, 2002 | |
| INVENTOR(S) | : Makoto Hanabata | |

It is certified that error appears in the above-identified patent and that said Letters Patent is hereby corrected as shown below:

<u>Title page, Item [54] and Column 1, lines 1-3,</u>
The Title should read: -- PIEZOELECTIC THIN FILM ELEMENT, PROCESS FOR PRODUCING THE SAME AND INK JET RECORDING HEAD --

Signed and Sealed this

Eighteenth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,478,412 B1
DATED : November 12, 2002
INVENTOR(S) : Makoto Hanabata It is certified that error appears in the above-identified patent and that said Letters Patent is hereby corrected as shown below:

<u>Title page, Item [54] and Column 1, lines 1-3,</u>
The Title should read: -- PIEZOELECTRIC THIN FILM ELEMENT, PROCESS FOR PRODUCING THE SAME AND INK JET RECORDING HEAD --

This certificate supersedes Certificate of Correction issued March 18, 2003.

Signed and Sealed this

Eighth Day of July, 2003

JAMES E. ROGAN
*Director of the United States Patent and Trademark Office*